(12) United States Patent
Shirota et al.

(10) Patent No.: US 9,899,507 B2
(45) Date of Patent: Feb. 20, 2018

(54) NITRIDE SEMICONDUCTOR TRANSISTOR DEVICE

(71) Applicants: Riichiro Shirota, Hsinchu County (TW); Shinichiro Takatani, New Taipei (TW)

(72) Inventors: Riichiro Shirota, Hsinchu County (TW); Shinichiro Takatani, New Taipei (TW)

(*) Notice: Subject to any disclaimer, the term of this patent is extended or adjusted under 35 U.S.C. 154(b) by 0 days.

(21) Appl. No.: 15/390,590

(22) Filed: Dec. 26, 2016

(65) Prior Publication Data

US 2017/0194474 A1 Jul. 6, 2017

(30) Foreign Application Priority Data

Jan. 6, 2016 (JP) ................................. 2016-000966

(51) Int. Cl.
| | |
|---|---|
| *H01L 21/84* | (2006.01) |
| *H01L 27/06* | (2006.01) |
| *H01L 29/20* | (2006.01) |
| *H01L 29/423* | (2006.01) |

(Continued)

(52) U.S. Cl.
CPC ...... *H01L 29/7787* (2013.01); *H01L 29/0642* (2013.01); *H01L 29/2003* (2013.01);
(Continued)

(58) Field of Classification Search
CPC ............... H01L 29/4232; H01L 29/513; H01L 29/66431; H01L 29/778; H01L 29/803; H01L 29/7787
See application file for complete search history.

(56) References Cited

U.S. PATENT DOCUMENTS

| | | | |
|---|---|---|---|
| 2007/0187718 A1* | 8/2007 | Suzuki | H01L 29/66462 257/194 |
| 2008/0090350 A1* | 4/2008 | Yan | H01L 27/105 438/257 |

(Continued)

OTHER PUBLICATIONS

Yasuhiro Uemoto et al., Gate Injection Transistor (GIT)—A Normally-Off AlGaN/GaN Power Transistor Using Conductivity Modulation, IEEE Transactions on Electron Devices, Dec. 2007, 7 pages, vol. 54, No. 12, IEEE.

(Continued)

*Primary Examiner* — Kimberly Rizkallah
*Assistant Examiner* — Brian Turner
(74) *Attorney, Agent, or Firm* — Alan D. Kamrath; Kamrath IP Lawfirm, P.A.

(57) ABSTRACT

A nitride semiconductor transistor device provides a normally-off nitride semiconductor transistor device which is excellent in switching properties with less dispersion of the properties. The nitride semiconductor transistor device has a buffer layer, a GaN layer, and an AlGaN layer in turn grown on a substrate. A first insulating film, a charge storage layer, a second insulating film, and a control electrode are in turn grown on the AlGaN layer. A source electrode and a drain electrode are formed to sandwich the charge storage layer over the AlGaN layer. A threshold voltage to shut off an electric current flowing between the source and drain electrodes through a conductive channel induced at an interface of the AlGaN layer and the GaN layer is made positive by adjusting the charge stored in the charge storage layer.

16 Claims, 27 Drawing Sheets

(51) Int. Cl.

| | |
|---|---|
| *H01L 29/739* | (2006.01) |
| *H01L 29/778* | (2006.01) |
| *H01L 21/335* | (2006.01) |
| *H01L 29/06* | (2006.01) |
| *H01L 29/205* | (2006.01) |
| *H01L 29/417* | (2006.01) |
| *H01L 29/51* | (2006.01) |
| *H01L 29/788* | (2006.01) |
| *H01L 29/792* | (2006.01) |

(52) U.S. Cl.
CPC ...... *H01L 29/205* (2013.01); *H01L 29/41758* (2013.01); *H01L 29/4236* (2013.01); *H01L 29/517* (2013.01); *H01L 29/788* (2013.01); *H01L 29/792* (2013.01)

(56) References Cited

U.S. PATENT DOCUMENTS

| | | | |
|---|---|---|---|
| 2012/0235156 A1* | 9/2012 | Kuraguchi | H01L 29/7787 257/76 |
| 2014/0227843 A1* | 8/2014 | Tsukamoto | H01L 29/6659 438/275 |

OTHER PUBLICATIONS

Masahito Kanamura et al., Enhancement-Mode GaN MIS-HEMTs With n-GaN/i-AlN/n-GaN Triple Cap Layer and High-k Gate Dielectrics, IEEE Electron Device Letters, Mar. 2010, 3 pages, vol. 31, No. 3, IEEE.

* cited by examiner

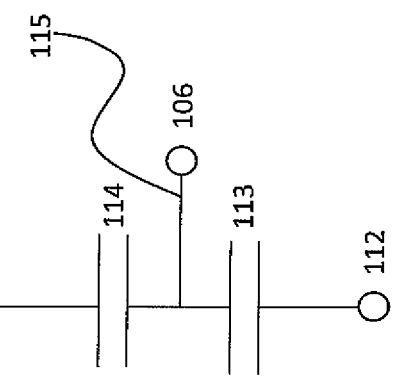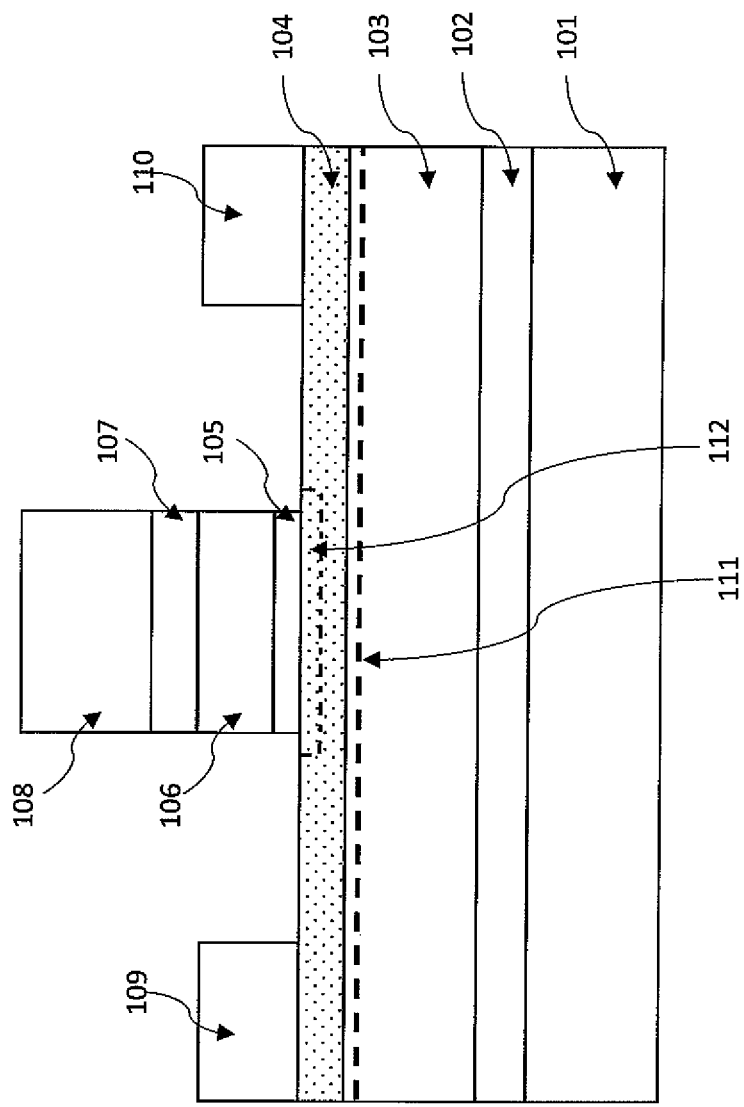
Fig. 1(a)
Fig. 1(b)

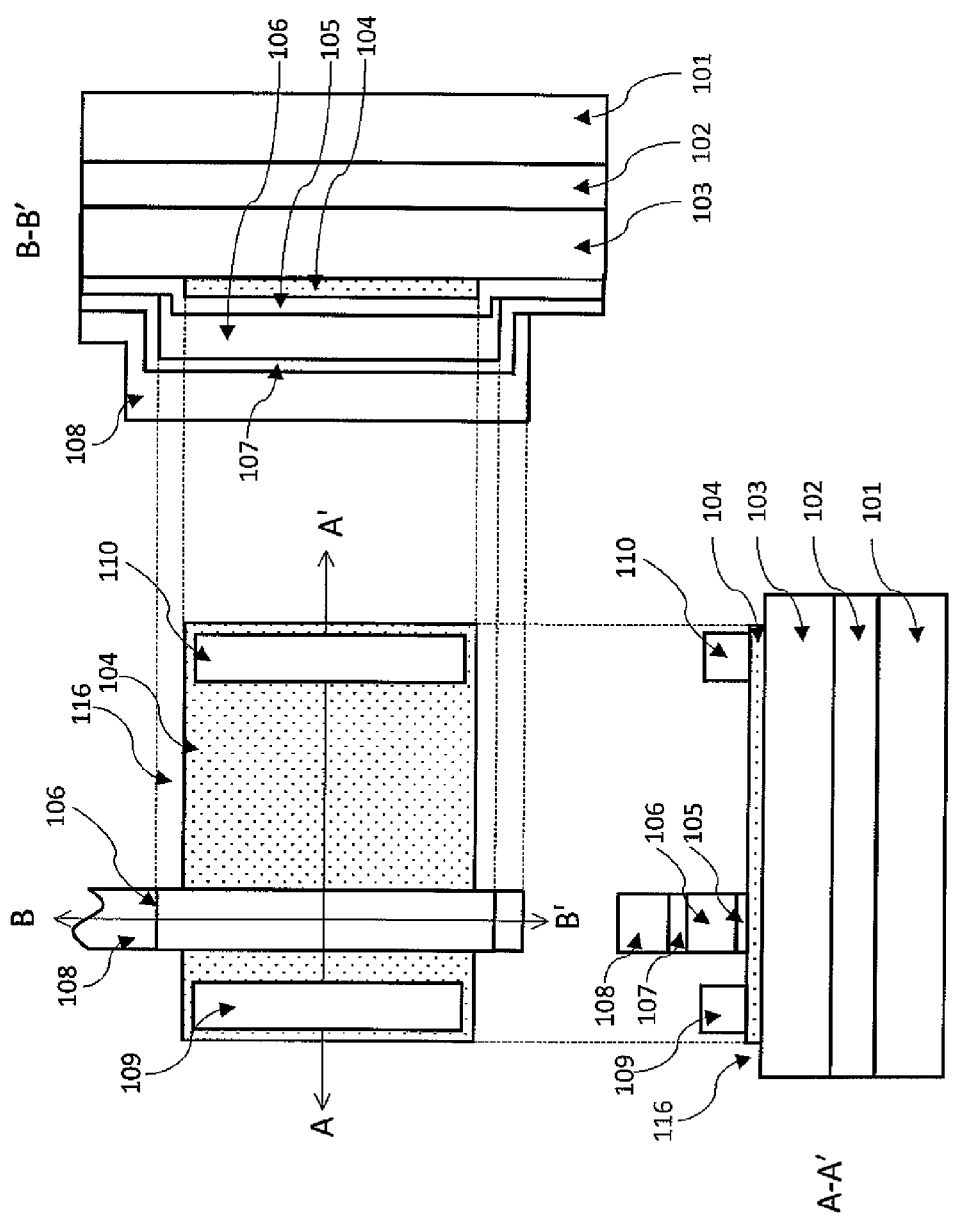

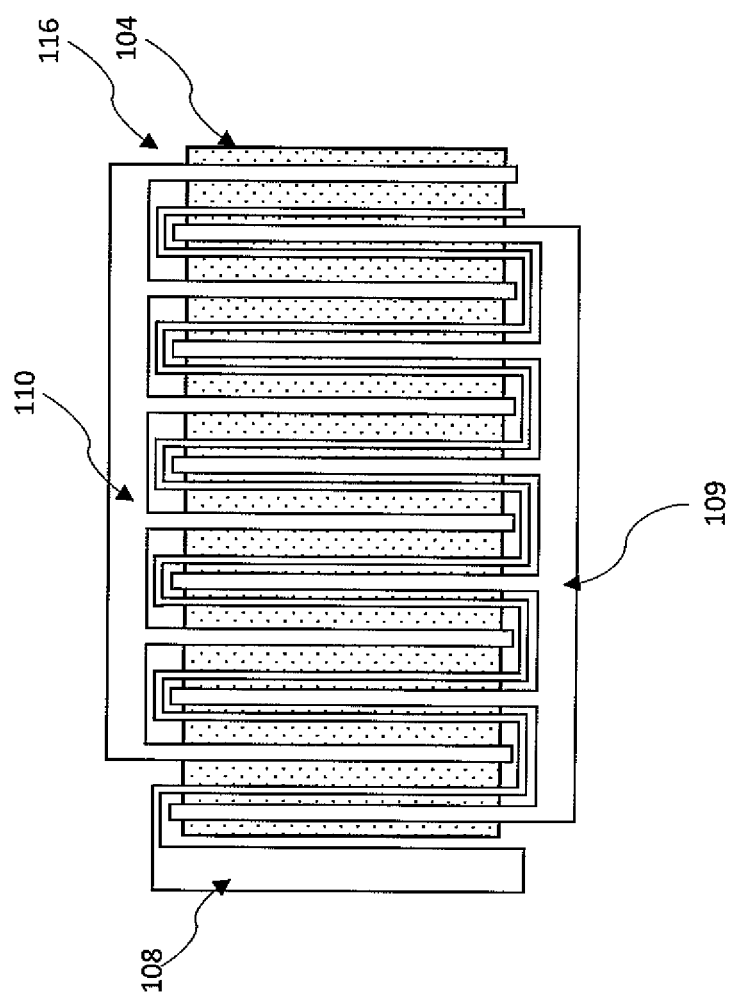

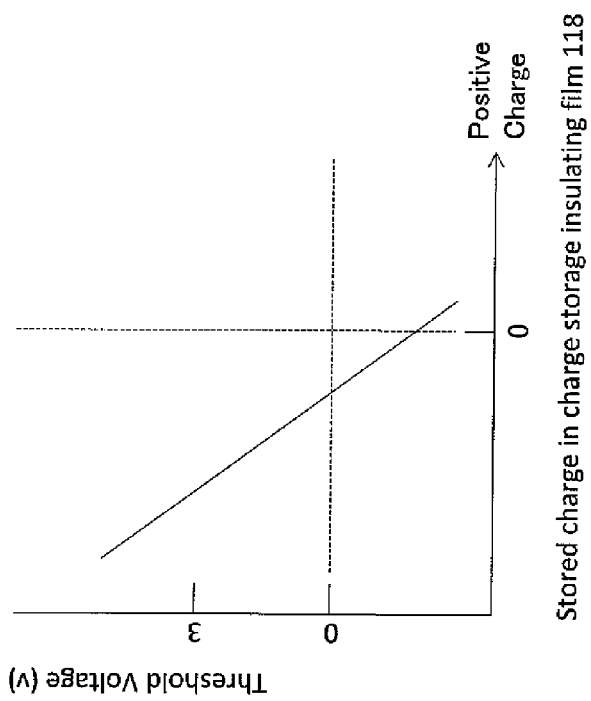
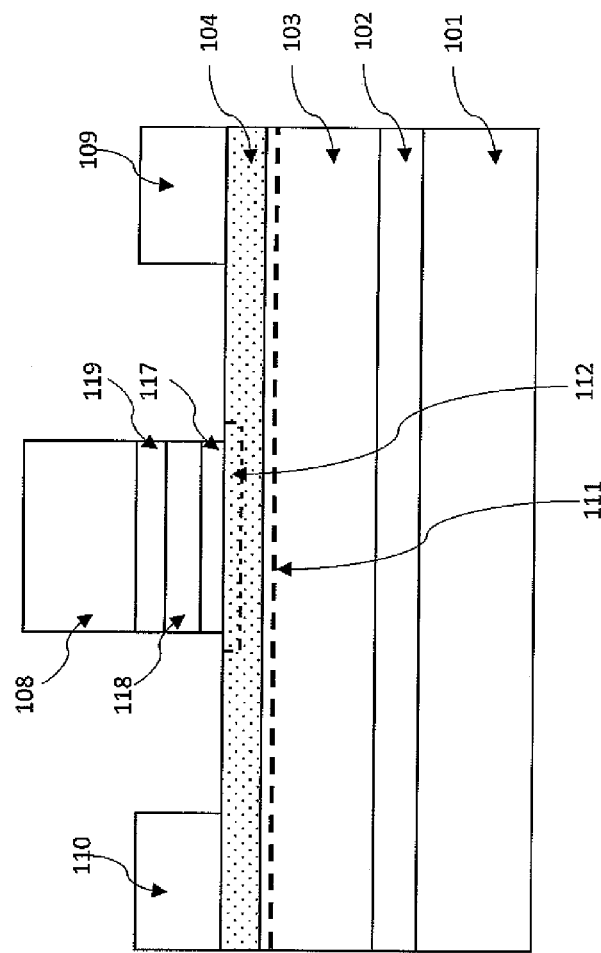
Fig. 5(b)
Fig. 5(a)

NITRIDE SEMICONDUCTOR TRANSISTOR DEVICE

CROSS REFERENCE TO RELATED APPLICATIONS

The application claims the benefit of Japan application serial No. 2016-000966, filed on Jan. 6, 2016, and the subject matter of which is incorporated herein by reference.

BACKGROUND OF THE INVENTION

1. Field of the Invention

The present disclosure generally relates to nitride semiconductor transistor devices and, more particularly, to field-effect transistors where a conductive channel beneath a gate electrode is practically switched off without gate voltage being applied on the gate electrode. In other words, it relates to normally-off type transistor devices of a nitride semiconductor transistor.

2. Description of the Related Art

GaN, AlN, and InN which are nitride semiconductors or semiconductors of mixed crystal of those nitride semiconductors, may have a wide band gap and a high mobility of conduction electrons and, thus, may be suitable for high-voltage high-output electron devices. In particular, the operation of a low on-resistance with a large current under high-voltage is possible in field-effect transistors (FETs) formed of nitride semiconductors and one of those embodiments. That is, in a high electron mobility transistor (HEMT), conduction electrons induced at the interface of a semiconductor heterojunction of AlGaN/GaN, etc., transport through a conductive channel. Thereby, those FETs and HEMTs have been used for high-output power amplifiers and/or high-power switching devices.

However, in usual nitride semiconductor FETs, the conductive channel beneath the gate electrode is in an on-state with no voltage being applied to the gate electrode. Accordingly, those FETs are normally-on. In the case that those normally-on switching devices are used in power supply apparatuses, the switch is opened while the control voltage to be applied to the gate electrode is lost due to an unknown error operation, etc. This may cause the system to be totally broken. Therefore, the normally-on FET is decisively unsuitable for the high-power switching devices to be used in a power supply from the viewpoint of safety.

For this reason, several technologies to make nitride semiconductor FETs normally-off have been developed. As an example among them, it is known that a p-type nitride semiconductor layer inserted beneath the gate of FET to form a PN junction type gate electrode can provide a normally-off operation. (See Y. Uemoto et al., IEEE Transactions on Electron Devices Volume 54, Number 12, December 2007, p. 3393.) In this technology, the operation range of a gate voltage is limited to the flat band voltage determined by the semiconductor band gap. Thereby, any positive threshold voltage must be less than 2 V, which is insufficient because the positive threshold voltage is required to be more than 3V in usual power-supply apparatuses. Moreover, a positive voltage to be applied to the gate electrode is limited by the on-voltage of the PN junction. The small gate voltage amplitude limits the magnitude of the electric current flowing through the conductive channel in the on-state of FET.

In another method to achieve the normally-off FET, an insulating film is inserted beneath the gate of the FET to form a Metal-Insulator-Semiconductor (MIS) junction gate electrode. (See M. Kanamura et al., IEEE Electron Device Letters, Volume 31, Number 3, March 2010, p.189.) Since there is the insulator beneath the gate metal in this method, the leakage current flowing through the gate electrode is suppressed, which enables the device operation at a large positive gate voltage. Thus, the amplitude range of the gate voltage is able to be wide enough even for a large positive threshold voltage, compared with the PN junction type gate electrode.

FIG. 7 is a drawing illustrating the cross-sectional structure of main parts of GaN FET having the conventional MIS-type gate electrode. The material of the substrate 1001 may be Silicon-carbide (SiC), Silicon (Si), Sapphire, GaN and so forth. The buffer layer 1002, the GaN layer 1003, and the AlGaN layer 1004 are in turn formed by the epitaxial growth and layered on this substrate 1001. The AlGaN layer 1004 below the gate electrode is partially removed by the recess etching process. The gate electrode 1007 is formed by inserting the insulating film 1005 in the recess etching portion 1006. Subsequently, the source electrode 1008 and the drain electrode 1009 are formed to complete the main parts of the GaN HEMT. The material for the insulating film 1005 may be, for example, aluminum oxide, silicon oxide, silicon nitride, or other hitherto known gate insulating materials. The conduction electrons are induced on the side of GaN layer 1003 at the interface between the GaN layer 1003 and the AlGaN layer 1004 having a wider band gap than the GaN layer 1003. Thus, the conductive channel 1010 is formed. The conduction electron density in the conductive channel 1010 directly beneath the gate electrode 1007 is controlled by the voltage to be applied to the gate electrode 1007. Then, transistor operation may be obtained. This conventional FET uses the conductive channel formed at the interface of an AlGaN/GaN semiconductor hetero structure, and is called HEMT as one of FETs.

FIG. 8 is a drawing illustrating the cross-sectional structure of a main part of a GaN FET having another type of the conventional MIS gate electrode. Similar to the illustration in FIG. 7, the material for the substrate 1101 may be Silicon-carbide (SiC), Silicon (Si), Sapphire, GaN and so forth. The buffer layer 1102, the GaN layer 1103, and the AlGaN layer 1104 are in turn formed by the epitaxial growth and layered on the substrate 1101. Moreover, the material for the insulating film 1105 may be, for example, aluminum oxide, silicon oxide, silicon nitride, or other hitherto known gate insulating materials. Different from the illustration in FIG. 7, the recess etching portion 1106 is deeper, and its bottom portion goes through the AlGaN layer 1104 to reach the GaN layer 1103. The conductive channels 1101 formed at the interface of AlGaN/GaN are respectively spread on both sides of the gate electrode 1007, and electrically connect between the source electrode 1108 and the gate electrode 1107, and between the drain electrode 1109 and the gate electrode 1107. The conductive channel 1111 directly beneath the gate electrode 1107 is formed by conduction electrons induced at the interface between the insulating film 1105 and the GaN layer 1103. The density of those conduction electrons is controlled by the voltage to be applied to the gate electrode 1107, and the transistor operation may be obtained.

SUMMARY OF THE INVENTION

In the conventional example shown in FIG. 7, the recess etching portion 1006 is formed in the gate electrode to make a threshold voltage of FET positive and FET normally-off. The nitride semiconductors used in the conventional electron devices may have a hexagonal crystal structure. The layer grown along the c-axis is likely used for the ease of epitaxial growth. In this case, a large polarization may be caused by piezoelectric polarization and spontaneous polarization along the direction perpendicular to the surface of the AlGaN layer 1004 (c-axis).

FIGS. 9(*a*) and (*b*) are drawings illustrating the band diagram of the semiconductor layer beneath the gate electrode. The gate voltage is not applied in those figures. In FIG. 9(*b*), the thickness of the AlGaN layer 1004 is thinner than in FIG. 9(*a*). The conduction band edge 1201 is lowered as the distance from the gate electrode increases due to the polarization (P) 1202 in the AlGaN layer 1004 in both figures. Accordingly, as illustrated in FIG. 9(*a*), the energy level of the quantized ground state formed in the triangle potential well at the interface between the AlGaN layer 1004 and the GaN layer 1003 is lower than the Fermi level 1203 (labeled "EF" in the figure) when the AlGaN layer 1004 is thicker. Thus, the conduction electrons are induced in the quantum well to form the conduction channel 1010. In order for the switch to become normally-off due to the practically zero density of conduction electrons induced in conductive channel while the gate voltage is zero, the thickness of the AlGaN layer 1004 is necessary to be thin, as illustrated in FIG. 9(*b*).

The composition of an alloyed crystal ratio of AlN in the AlGaN layer 1004 may be described as $AL_xGA_{1-x}N$. As mentioned in M. Kanamura et al., in the case that x is 20%, for example, the AlGaN layer 1004 beneath the gate electrode 1007 needs to be about 2 nm. If x is increased, the AlGaN layer 1004 needs to further become thinner. On the other hand, the AlGaN layer 1004 that is divided into the regions between the source electrode 1008 and the gate electrode 1007 and between the drain electrode 1009 and the gate electrode 1007 as shown in FIG. 7, should be 10 nm or more to get sufficient quantity of conduction electrons which may reduce the resistivity of the conductive channel 1010 at the AlGaN/GaN interface. Therefore, as illustrated in FIG. 7, it is necessary that a thick AlGaN layer 1004 is grown to be spread throughout in advance. Subsequently, the AlGaN layer may be made thinner in only the portion to form the gate electrode by the recess etching process. However, the etching depth of the recess etching portion 1006 must be precisely controlled in the actual fabrication of transistors because, otherwise the threshold voltage varies widely due to the thickness variation of the residual AlGaN layer after the etching. Accordingly, in the case that a plurality of transistors are simultaneously fabricated on the substrate 1001, it is difficult to suppress the dispersion of the etching depth in the layer.

The conventional example shown in FIG. 7 has another problem. There are, generally, a plurality of traps spreading in several hundred milli-electron volts below the conduction band edge at the interface between the nitride semiconductor and the insulator. FIG. 9(*c*) is a drawing illustrating the band diagram where conduction electrons are induced in the conductive channel 1010 by applying a positive gate voltage 1205 (labeled "V" in the figure) to the gate electrode 1007 for the case in which the AlGaN layer 1004 is thin enough to make the transistor normally-off The Fermi level 1203 is pinned by the trap levels 1204 at the interface between the insulating film 1005 and the AlGaN layer 1004, and the accumulation of conduction electrons in the conductive channel 1010 is suppressed when the positive gate voltage 1205 is large. As a result, the on-resistance is not lowered, and the on-current is not increased. Thus, the switching property is substantially degraded.

On the other hand, the prior art shown in FIG. 8 is different from that shown in FIG. 7 in the sense that the recess etching portion 1106 goes through the AlGaN layer 1104 to reach the GaN Layer 1103. As a result, the conductive channel is free from the polarization of the AlGaN layer 1104. The control of the AlGaN layer etching depth is no longer a problem. However, the mobility of conduction electrons induced in the conductive channel 1111 formed at the interface between the insulating film 1105 and the GaN layer 1103 is much smaller than that of conduction electrons induced at the interface AlGaN/GaN. Thus, there is a problem that the basic transistor performance of the device shown in FIG. 8 cannot be as good as the HEMT shown in FIG. 7. Additionally, this prior art also has the problem that trap levels at the interface between the insulating film 1105 and the GaN layer 1103 suppresses the accumulation of conduction electrons in the conductive channel 1111, which is similar to the case for the prior art shown in FIG. 7. Consequently, the on-resistance is not lowered, and the on-current is not increased. Thus, the switching property may be degraded. Accordingly, the present disclosure aims to provide a normally-off nitride semiconductor transistor device which can solve the problems of the conventional nitride semiconductor FETs mentioned above.

In order to solve the above-mentioned problems, the invention of the nitride semiconductor transistor device in the present disclosure may have a substrate, a first nitride semiconductor layer formed over the substrate, a second nitride semiconductor layer formed over the first nitride semiconductor layer having a wider band gap than the first nitride semiconductor layer, a first insulating film formed over the second nitride semiconductor layer, a charge storage layer made of metal or a low resistivity layer having a portion thereof formed over the first insulating film formed over the second nitride semiconductor layer, source and drain electrodes which are formed over the second nitride semiconductor layer with the charge storage layer being sandwiched and planar, and a first control electrode which is electrostatic-capacitively coupled with the charge storage layer via a first capacitor. A voltage applied to the first control electrode may control an electric current flowing between the source and drain electrodes through a conductive channel at an interface between the first and second nitride semiconductor layers by varying a potential of the charge storage layer. A threshold voltage for the first control electrode to shut off the electric current is made positive by the negative charge accumulated in the charge storage layer.

According to the invention, it obtains a normally-off nitride semiconductor transistor device with a better threshold voltage uniformity, because the precise control of the etching depth of the second nitride semiconductor layer to make the threshold voltage positive is unnecessary. Furthermore, with the use of a thick second nitride semiconductor layer, the conductive channel is less influenced by the interface states existing between the second nitride semiconductor layer and the first insulating film when the electric current flowing through the conductive channel is increased by increasing the voltage applied to the first control gate. As a result, a normally-off transistor device which is excellent in switching properties, such as on-resistance, on-current and so forth, may be obtained.

In a preferred embodiment of the invention, a second insulating film may be formed over at least a portion of the charge storage layer, and the first control electrode is formed over the second insulating film. The second insulating film sandwiched by the charge storage layer and the first control electrode may serve as an interlayer film and form the first capacitor. For example, the second insulating film and the first control electrode may be stacked over the charge storage layer formed over the second nitride semiconductor layer between the source and drain electrodes.

In another preferred embodiment of the invention, a cell isolation region which is electrically inactive may be formed on the substrate. The charge storage layer may be extended to overlap with the cell isolation region. At least a portion of the second insulating film may be formed over the portion that the charge storage layer overlaps with the cell isolation region. At least a portion of the first control electrode may be formed over the second insulating film which is formed above the portion that the charge storage layer overlaps with the cell isolation region.

In both of the above-mentioned two preferred embodiments of the invention, a capacitance of the first capacitor may be preferably larger than a capacitance of a second capacitor formed between the charge storage layer and the second nitride semiconductor layer. Therefore, the on-resistance and the on-current become more dependent on the voltage applied to the first control electrode. Accordingly, it may be preferred that a permittivity of the second insulating film is higher than a permittivity of the first insulating film. Alternatively, it may be preferred that an area of the first capacitor formed by the second insulating film as the interlayer film between the charge storage layer and the first control electrode is larger than the area of the second capacitor formed by the first insulating film as the interlayer film between the charge storage layer and the second nitride semiconductor layer. In particular, in the case that at least a portion of the first capacitor uses the charge storage layer formed to overlap with the cell isolation region, it may be easy to enlarge the area of the first capacitor.

In another preferred embodiment of the invention, a cell isolation region which is electrically inactive may be formed on the substrate. The charge storage layer may overlap with the cell isolation region. At least a portion of the second insulating film may be formed over the portion that the charge storage layer overlaps with the cell isolation region. At least a portion of the first control electrode may be stacked over the second insulating film formed over the portion that the charge storage layer overlaps with the cell isolation region. Furthermore, a third insulating film may be formed in at least a portion of the cell isolation region. At least a part of the portion that the charge storage layer overlaps with the cell isolation region may be formed over the third insulating film. Therefore, it reduces a parasitic capacitance induced between the portion that the charge storage layer overlaps with the cell isolation region and the nitride semiconductor layer underlying in the cell isolation region. As a result, it reduces the quantity of the negative charge to be given to the charge storage layer to make the threshold voltage positive.

In another preferred embodiment of the invention, the third insulating film may be thicker than the first insulating film. This may suppress the influence of parasitic capacitance induced between the portion that the charge storage layer overlaps with the cell isolation region and the nitride semiconductor layer underlying in the cell isolation region.

In another preferred embodiment, the second control electrode may be formed above the second nitride semiconductor layer between the charge storage layer and the drain electrode. The electric current flowing between the source and drain electrodes through the conductive channel between the first and second nitride semiconductor layers is controlled with the voltage applied to the second control electrode. The threshold voltage to shut off the electric current with the voltage applied to the second control electrode is negative. Thus, in the case that a large voltage is applied to the drain electrode while the switch is under stand-by, the potential drop due to this voltage may mainly occur between the second control electrode and the drain electrode. The aging variation of the threshold voltage may be suppressed, since the negative charge stored in the charge storage layer is hardly emitted owing to the absence of an excessive potential difference between the charge storage layer and the second nitride semiconductor layer therebelow.

In another preferred embodiment of the invention, the first nitride semiconductor layer may be made of GaN, and the second nitride semiconductor layer may be made of $Al_xGa_{1-x}N$ ($0<x\leq1$) Since the conductive channel induced between GaN and $Al_xGa_{1-x}N$ has a high carrier mobility, it obtains a normally-off nitride semiconductor transistor device which is excellent in switching properties such as on-resistance, on-current and so on.

Additionally, in another preferred embodiment of the invention, at least a bottom layer of the first insulating film may be formed of aluminum oxide. Aluminum oxide may induce less interface traps at the interface with the nitride semiconductors than other insulating films. This may enable the device operation at a more positive voltage applied to the first control electrode. In other words, the conductive channel induced between the first and second nitride semiconductor layers is less influenced by the interface traps arising between the second nitride semiconductor layer and the first insulating film when increasing the electric current flowing through the conductive channel. Accordingly, a normally-off transistor device, which is excellent in switching properties such as on-resistance, on-current, etc., may be obtained.

In order to solve the above-mentioned problems, the nitride semiconductor transistor device of the invention in the present disclosure may have a substrate, a first nitride semiconductor layer formed over the substrate, a second nitride semiconductor layer formed over the first nitride semiconductor layer having a band gap wider than a band gap in the first nitride semiconductor layer, a first insulating film formed over the second nitride semiconductor layer, a charge storage insulating film formed over the first insulating film and made of insulating film in which a band gap may be narrower than a band gap of the first insulating film, a second insulating film formed over the charge storage insulating film, a first control electrode formed over the second insulating film in which a band gap may be wider than the band gap of the charge storage insulating film, and a source electrode and a drain electrode which are formed over the second nitride semiconductor layer, and the first control electrode is sandwiched between the source and drain electrodes in a horizontal direction along the second nitride semiconductor layer. The charge storage insulating film may have charge traps with energy levels inside the band gaps of both the first and second insulating films, and the negative charge may be at least partly stored in the charge traps. The voltage applied to the first electrode controls an electric current flowing between the source and drain electrodes through a conductive channel induced at an interface between the first and second nitride semiconductors. The threshold voltage to shut off the electric current with the voltage applied to the first control electrode may be made positive by storing the negative charge in the charge storage insulating film.

According to the invention of the present disclosure, it is unnecessary to precisely control the etching depth of the second nitride semiconductor layer to make the threshold voltage positive. Consequently, a normally-off nitride semiconductor transistor device with less variation of the threshold voltage may be obtained. Furthermore, with the use of a thick second nitride semiconductor layer, the conductive channel is less influenced by the interface trap levels existing between the second nitride semiconductor layer and the first insulating film when the electric current flowing through the conductive channel is increased by increasing the voltage applied to the first control gate. As a result, a normally-off transistor device, which is excellent in switching properties such as on-resistance, on-current and so forth, may be obtained.

In a preferred embodiment of the invention of the present disclosure, the charge storage insulating film may be made of silicon nitride having a plurality of charge traps with energy levels inside both band gaps of the first and second insulating films. The charge traps may trap and store at least a portion of the negative charge. In addition, the band gap of silicon nitride is smaller than other insulators, for example, silicon oxide. Therefore, silicon nitride may easily store negative charges and hardly emit the negative charges once stored.

In another preferred embodiment of the invention of the present disclosure, a second control electrode may be formed between the first control electrode and the drain electrode over the second nitride semiconductor layer. The second control electrode controls the electric current flowing between the source and drain electrodes through the conduction channel at the interface between the first and second nitride semiconductor layers under the second control electrode. The threshold voltage to shut off the electric current with the voltage applied to the second control electrode is negative, but larger than −10 V. Thus, even in the case that a large voltage is applied to the drain electrode while the switch is at stand-by, this large drain voltage is mainly dropped across between the second control electrode and the drain electrode. Accordingly, the potential difference may not become large between the charge storage insulating film and the second nitride semiconductor layer just below the charge storage insulating film. The aging variation of the threshold voltage may be suppressed, since the negative charge stored in the charge storage insulating film is made difficult to leak.

In another preferred embodiment of the invention of the present disclosure, the first nitride semiconductor layer may be made of GaN. The second nitride semiconductor layer may be made of AlxGa1−xN (0<x≤1). Since the conductive channel induced between GaN and AlxGa1−xN may have a high carrier mobility, a normally-off nitride semiconductor transistor device, which is excellent in switching properties such as on-resistance, on-current and so forth, may be obtained.

Additionally, in another preferred embodiment of the invention of the present disclosure, at least a bottom layer of the first insulating film may be made of aluminum oxide. Aluminum oxide forms less interface traps at the interface with nitride semiconductors than other insulating films. Accordingly, the conductive channel is less influenced by the interface traps existing between the second nitride semiconductor layer and the first insulating film when increasing the electric current flowing through the conductive channel induced at the interface between the first and second nitride semiconductor layers by increasing the voltage applied to the first control electrode. Therefore, a normally-off nitride semiconductor transistor device, which is excellent in switching properties, such as on-resistance, on-current and so forth, may be obtained.

According to the invention of the present disclosure, normally-off nitride semiconductor transistor devices, which are excellent in switching properties such as on-resistance or on-current with high uniformity in those properties, may be obtained.

BRIEF DESCRIPTION OF THE DRAWINGS

The present disclosure will become more fully understood from the detailed description given hereinafter and the accompanying drawings which are given by way of illustration only, and thus are not limitative of the present disclosure, and wherein:

FIG. 1(a) is a cross-sectional view of a FET in the first embodiment of the present disclosure.

FIG. 1(b) is a diagrammatic view of an equivalent circuit of capacitors among nodes of the FET in the first embodiment.

FIG. 3 shows a horizontal projection and a cross-sectional view of an example of the FET in the first embodiment.

FIG. 4(d) is a horizontal projection of a FET in the fifth embodiment.

FIG. 5(a) is a cross-sectional view of a FET in the eighth embodiment.

FIG. 5(b) is a diagrammatic view of the relation between the threshold voltage and the stored charge of the FET in the eighth embodiment.

DETAILED DESCRIPTION OF THE INVENTION

Figure 7:
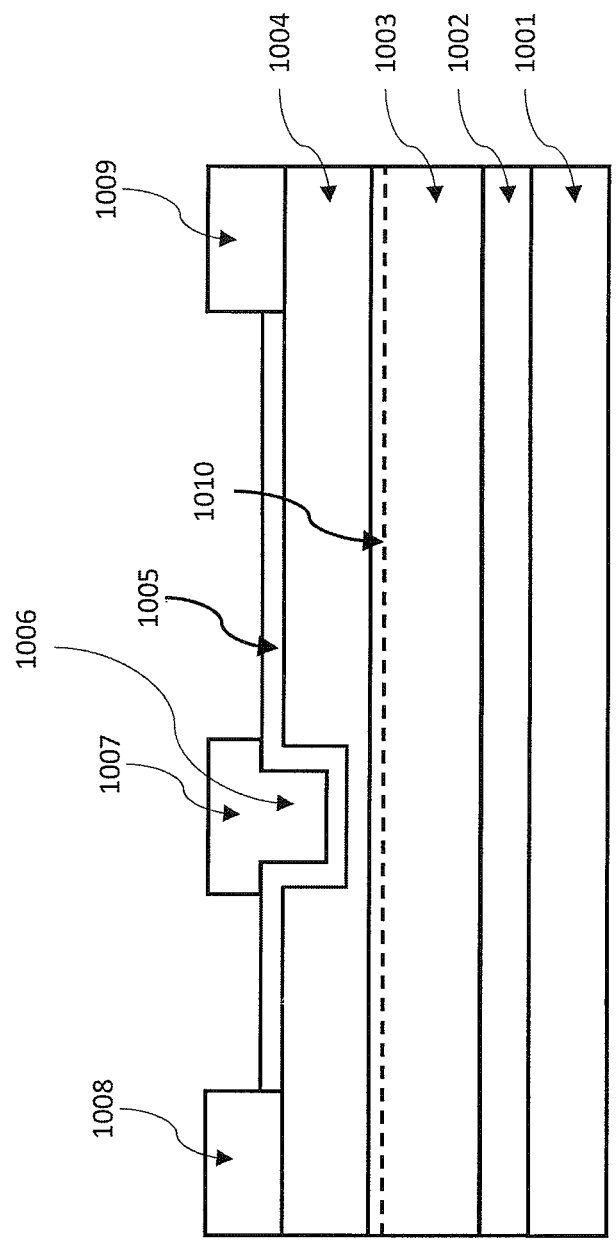
FIG. 7 is a cross-sectional view of a conventional FET.
Figure 8:
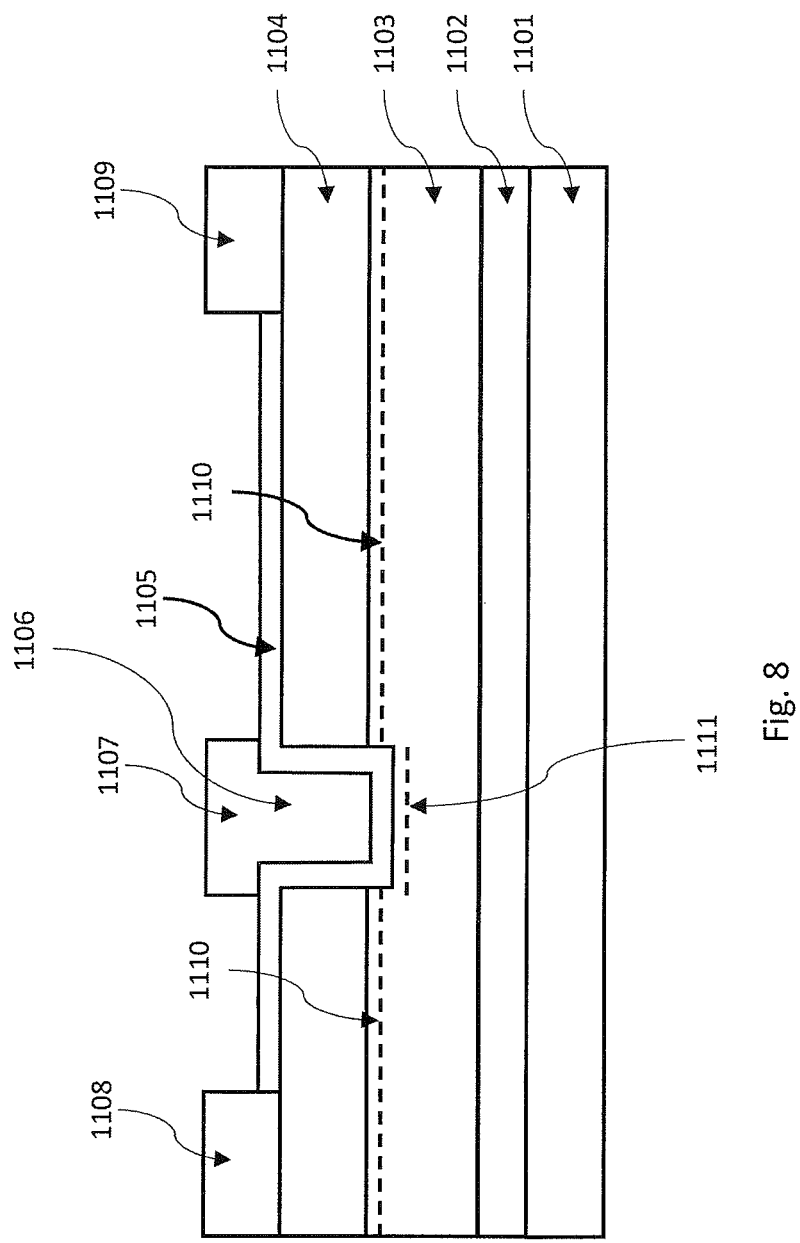
FIG. 8 is a cross-sectional view of another conventional FET.
Figure 9A:
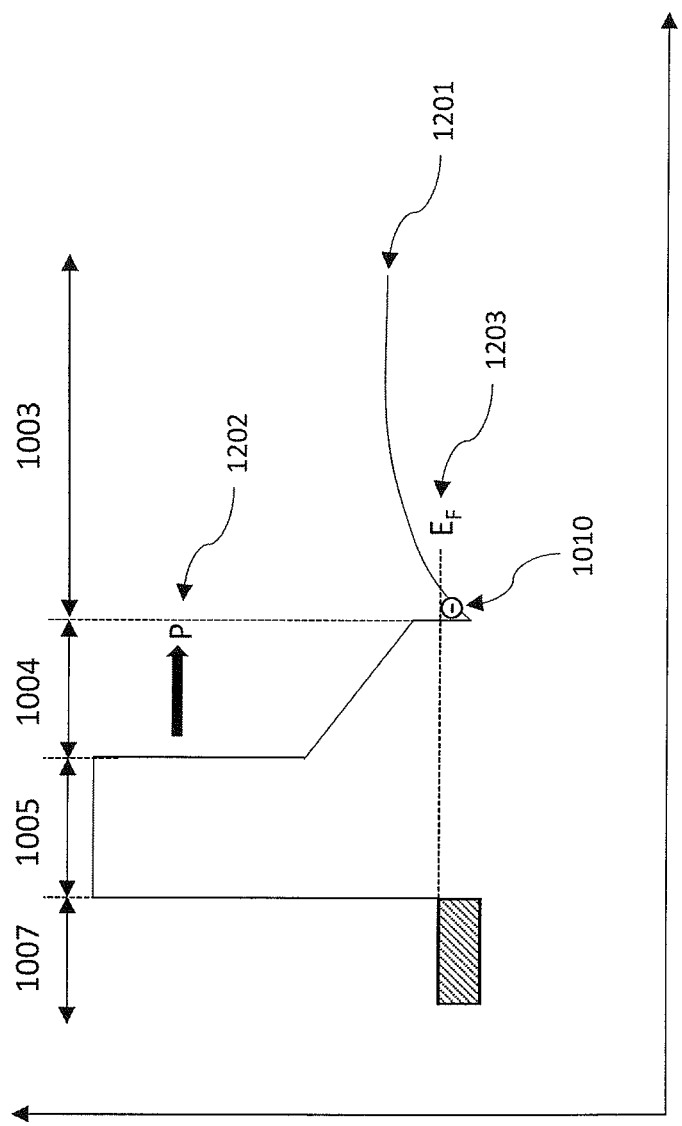
FIG. 9(a) is a band diagram of the conventional FET.
Figure 9B:
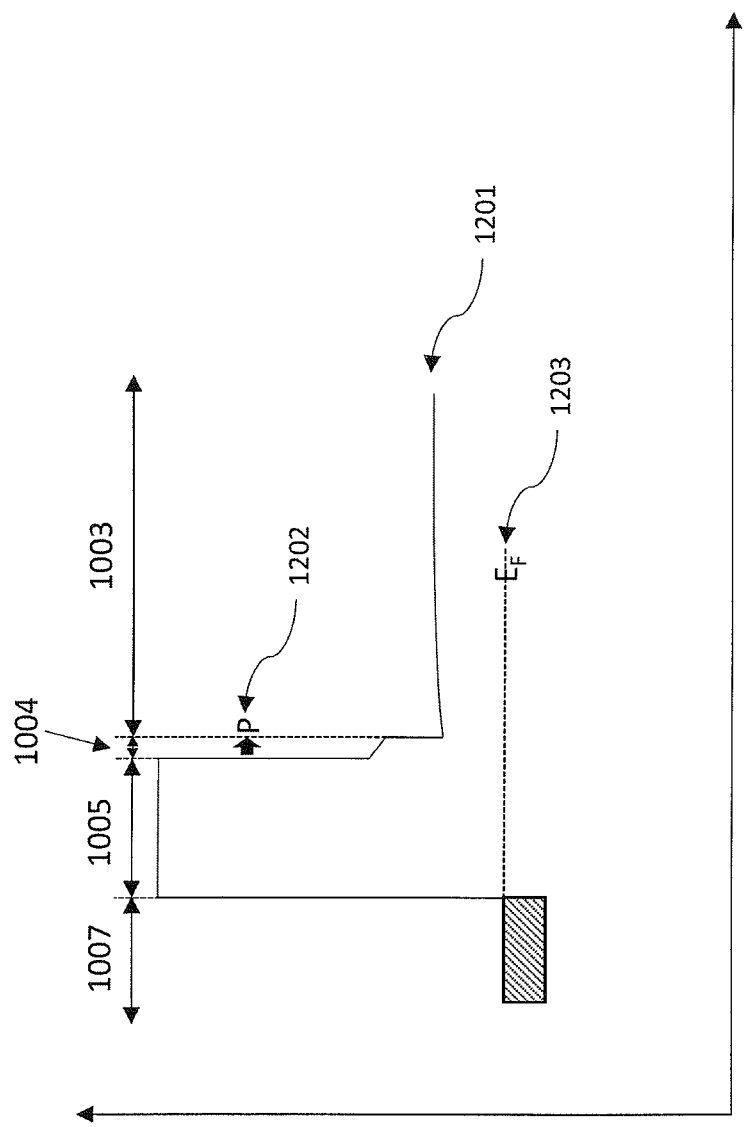
FIG. 9(b) is a band diagram of the conventional FET.
Figure 9C:
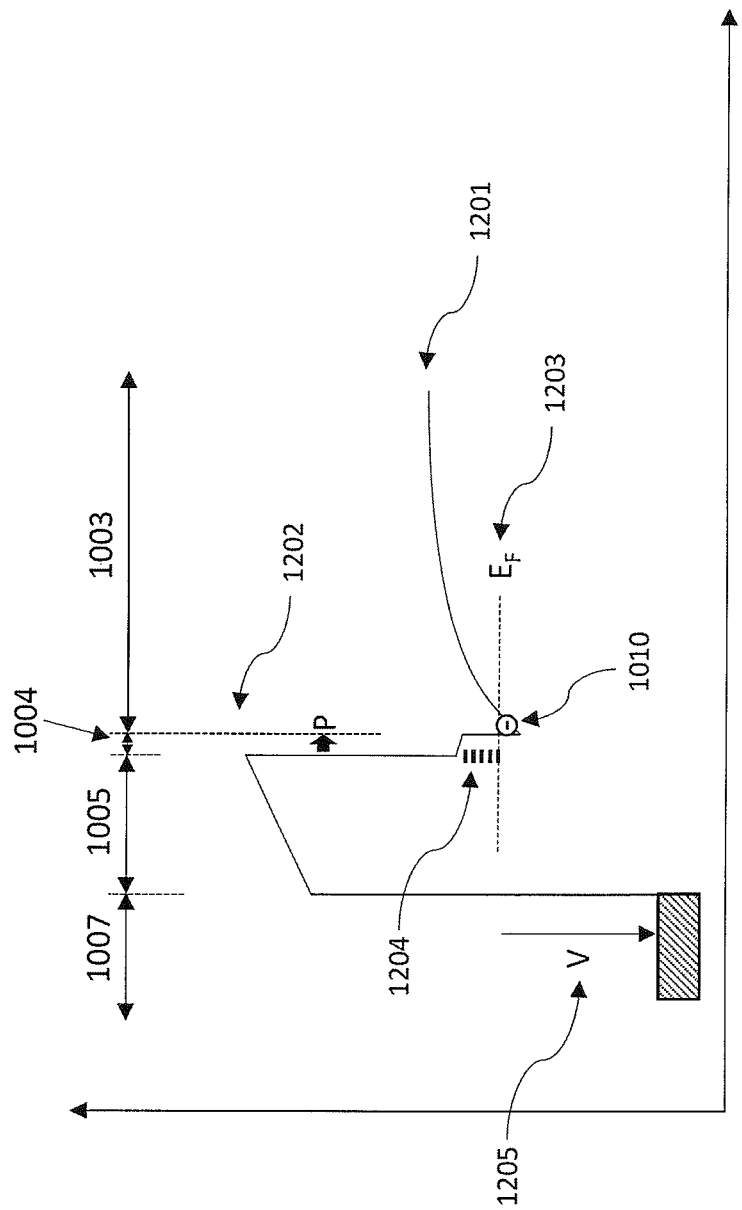
FIG. 9(c) is a band diagram of the conventional FET.

FIG. 1(a) is a cross-sectional view of a FET in the first embodiment of the invention of the present disclosure. A buffer layer 102, a GaN layer 103, and an AlGaN layer 104 are in turn grown on a substrate 101. The substrate 101 and the buffer layer 102 may be made of the same materials as those used in the prior art shown in FIG. 7. Next, an insulating film 105 and a gate electrode 106 may be deposited on the AlGaN layer 104. Then, another insulating film 107 and a conductive layer (to be called as a control gate electrode below) 108 may be deposited on the gate electrode (to be called as a charge storage layer below) 106 in turn. Furthermore, a source electrode 109 and the drain electrode 110 may be formed on the AlGaN layer 104. It is preferred that a thickness of the AlGaN layer 104 is 10 nm or more on both sides of the gate electrode 106 between the source electrode 109 and the gate electrode 106, and between the drain electrode 110 and the gate electrode 106. A sufficient quantity of conduction electrons may be induced in a conductive channel 111 at the interface AlGaN/GaN to reduce the resistivity of the regions. It may be preferred to tune the alloy crystal ratio of Al-to-N in the AlGaN layer 104, that is, the value of x in the chemical formula AlxGa1−xN, in order to avoid an excessive lattice relaxation in AlGaN having a different lattice constant from GaN. Usually, x may be ranging from 0.1 to 0.4. The gate electrode 106, in which the surrounding is covered by the insulating films 105 and 107, is electrically floating. Hereinafter, the gate electrode 106 and the conductive layer 108 may be called the charge storage layer 106 and the control electrode 108, respectively. Then, the source electrode 109, drain electrode 110 and control electrode 108 may be connected to external PINs when sealing it with a package. Moreover, it may be similar in other embodiments to be mentioned later that the electrodes connected to the external PINs are these three. A polycrystalline silicon doped with impurities may be adopted for the charge storage layer 106 as well as metallic layers. In this case, the impurities may be Phosphorus, Arsenide, Boron and so forth.

Figure 1C:
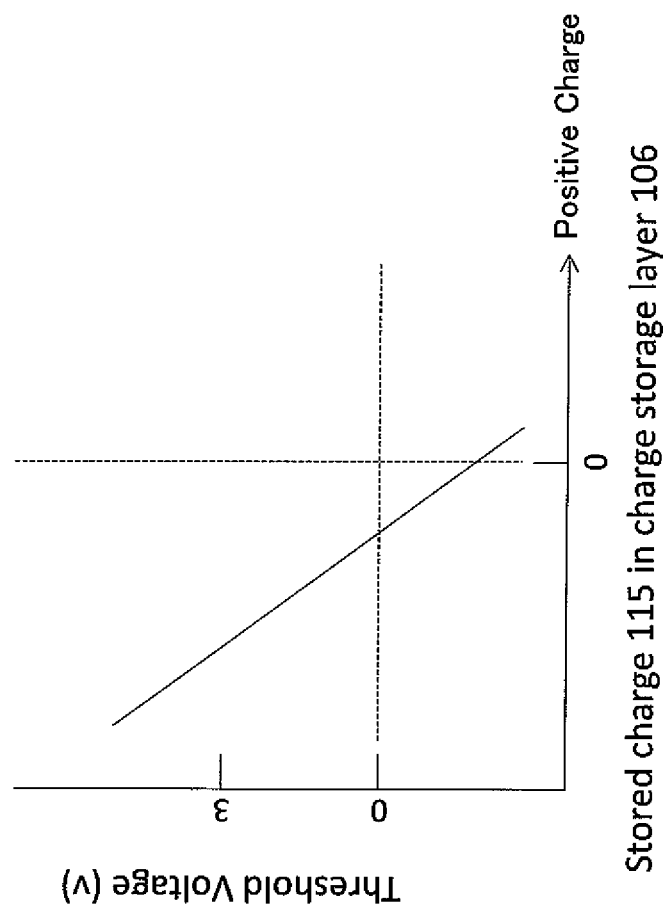
FIG. 1(c) is a diagrammatic view of the relation between the threshold voltage and the stored charge of the FET in the first embodiment.

The capacitances among nodes of the FET in FIG. 1(a) are shown in FIG. 1(b). A capacitor 113 is formed between the charge storage layer 106 and a surface 112 of the AlGaN layer 104 just below the charge storage layer 106. A capacitor 114 is formed between the charge storage layer 106 and the control electrode 108. The capacitors 114 and 113 are the first and second capacitors in the invention of the present disclosure, respectively. The charge storage layer 106 is electrostatic-capacitively coupled to the control electrode 108 via the capacitor 114. The charge storage layer 106 is further electrostatic-capacitively coupled to the AlGaN layer 104, particularly, the surface 112, via the capacitor 113. Thereby, a potential of the charge storage layer 106 is determined by potentials of the control electrode 108 and the surface 112 and a stored charge 115 in the charge storage layer 106. The potential is, generally, inhomogeneous along the horizontal direction at the surface 112. However, here, the surface 112 (just below the charge storage layer 106) is assumed to have a representative unique potential value. In the present structure, the terminals of the nitride semiconductor FET are the source electrode 109, the drain electrode 110 and the control electrode 108. While the potentials of the source electrode 109 and the drain electrode 110 and a quantity of the stored charge 115 in the charge storage layer 106 are fixed, the potential of the charge storage layer 106 is determined by the control electrode 108, i.e. as the potential of the control electrode increases, the potential of the charge storage layer 106 also increases. Furthermore, while the potentials of the source electrode 109, the drain electrode 110, and the control electrode 108 are fixed, the potential of the charge storage layer 106 is determined by the quantity of the stored charge 115 in the charge storage layer 106. The charge storage layer 106 becomes lower in potential if the stored charge 115 in the charge storage layer 106 becomes more negative. Accordingly, the threshold voltage of FET is determined by the quantity of the stored charge 115 in the charge storage layer 106. As shown in FIG. 1(c), the threshold voltage is increased as the charge is more negatively stored. Thereby, it may be possible to make the threshold voltage higher than 3V once the negative charge is stored more than a predetermined quantity in the charge storage layer 106 to obtain a normally-off condition.

In order to make the on-resistance and on-current more sensitive to the voltage applied to the control electrode 108, the capacitor 114 between the charge storage layer 106 and the control electrode 108 is made comparatively larger than the capacitor 113 between the charge storage layer 106 and the surface 112, thereby strengthening the electrostatic capacitive-coupling between the charge storage layer 106 and the control electrode 108. For this sake, it is preferred that the permittivity of the insulating film 107 on the charge storage layer 106 is higher than that of the insulating film 105 on the AlGaN layer 104. For example, the insulating film 105 on the AlGaN layer 104 may be silicon oxide, and the insulating film 107 on the charge storage layer 106 may be a high permittivity dielectric (e.g., aluminum oxide). If the charge storage layer 106 and the control electrode 108 are the same in area, the capacitance ratio of the capacitors 114 and 113 is expressed as ∈Al2O3tSiO2/∈SiO2tAl2O3, where ∈Al2O3 and ∈SiO2 are the permittivity of aluminum oxide (Al2O3) and silicon oxide (SiO2), respectively, and tSiO2 and tAl2O3 are the thicknesses of silicon oxide and aluminum oxide, respectively. Thus, the capacitor 114 is larger in capacitance than the capacitor 113, as long as tAl2O3/tSiO2 is smaller than ∈Al2O3/∈SiO2. Furthermore, it may also be preferred that the insulating film 105 on the AlGaN layer 104 is a multilayer of a plurality of different types of insulating films. For example, it may be a multilayer consisting of aluminum oxide and silicon oxide, or that of silicon nitride and silicon oxide. This configuration of the insulating film 105 may be similar in other embodiments to be mentioned below.

In order to inject a charge into the charge storage layer 106 to obtain the stored charge 115, a high voltage is applied to the control electrode 108 while the potentials of the source and drain electrodes 109 and 110 are 0 V. Thus, the potential of the charge storage layer 106 also becomes high due to the capacitive-coupling between the control electrode 108 and the charge storage layer 106. The electrons in the AlGaN layer 104 may pass through the insulating film 105 on the AlGaN layer by a tunneling effect and be injected into the charge storage layer 106. Since the charge storage layer 106 is surrounded by the insulating films 105 and 107, the electrons once having been injected thereto may hardly leak and thus may remain there. As shown in FIG. 1(c), the threshold voltage may be positive if the quantity of the stored charge 115 in the charge storage layer 106 exceeds a predetermined value. Then, a normally-off FET is obtained.

Another method to inject a charge into the charge storage layer 106 to obtain the stored charge 115 is that the FET is turned on by applying a certain positive potential to the control electrode 108 while a certain large voltage is applied between the source and drain electrodes 109 and 110. Thus, some of the electrons transporting through the conductive channel 111 may attain high energy at an edge portion of the control electrode 108 facing the source electrode 109 or the drain electrode 110, where the horizontal electric field becomes high enough. A portion of the high energy electrons may change their direction of transport due to scattering with GaN inside the conductive channel 111 and be injected to the charge storage layer 106 through the surface 112 and the insulating film 105. If the quantity of electrons having been injected to the charge storage layer 106 exceeds a predetermined value, the threshold voltage becomes positive, and the FET becomes normally-off.

Figure 2A:
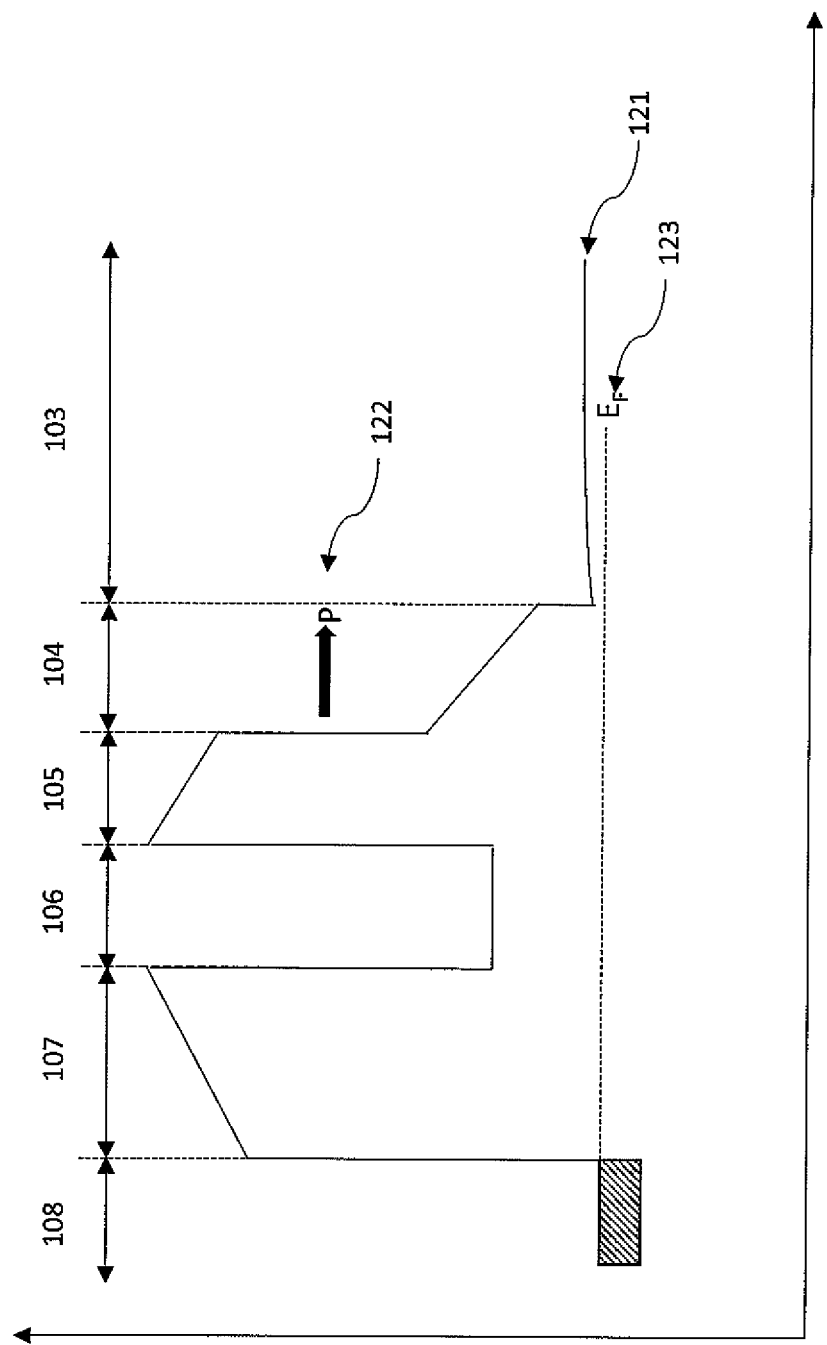
FIG. 2(a) is a band diagram of the FET in the first embodiment.

A band diagram of a normally-off FET is shown in FIG. 2(a), where no voltage is applied to the control electrode 108. The electron potential energy of the charge storage layer 106 is raised as the negative stored charge 115 is stored in the charge storage layer 106. Accordingly, as long as the quantity of the negative stored charge 115 is sufficient, a conduction band edge 121 of the GaN layer 103 is higher than a Fermi level (EF) 123 in such a way that the conduction electrons are not induced at the interface between the AlGaN layer 104 and the GaN layer 103, even though the polarization (P) 122 induced inside the AlGaN layer 104 causes a large potential drop across the AlGaN layer 104. Accordingly, it results in the state where the threshold voltage is positive, as shown in FIG. 1(c).

Figure 2B:
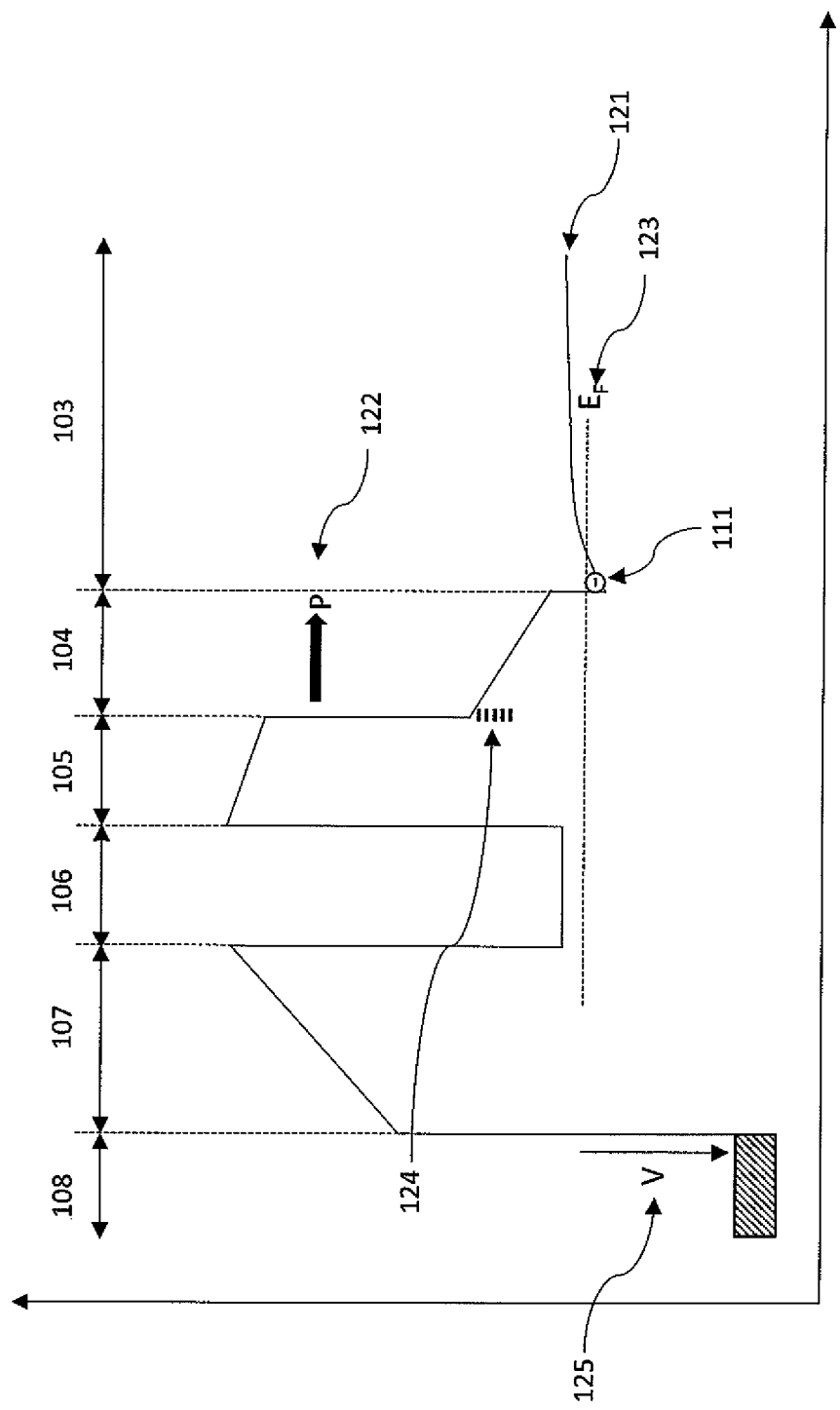
FIG. 2(b) is a band diagram of the FET in the first embodiment.

FIG. 2(b) shows a band diagram where a positive gate voltage 125 (labeled as V in the figure) is applied to the control electrode 108. The conduction band edge 121 is lower than the Fermi level 123 at the interface between the AlGaN layer 104 and the GaN layer 103, and conduction electrons are induced there to cause an electric current to flow through the conductive channel 111. In the present embodiment, without the AlGaN layer 104 being thin in the portion forming the control electrode 108, the transistor can be made normally-off by storing the negative charge in the charge storage layer 106. Thereby, it may be unnecessary to care about the dispersion of cell characteristics such as threshold voltage, etc. due to the thickness dispersion of the AlGaN layer 104 after etching like in the conventional practice. Furthermore, as shown in FIG. 2(b), the AlGaN layer 104 beneath the control electrode 108 is thick enough to make the trap levels 124 higher in energy than the Fermi level 123 at the interface between the insulating film 105 and the AlGaN layer 104. Accordingly, conduction electrons may not be hindered from being induced in the conductive channel 111 when the voltage is applied to the control electrode 108.

A case is not described in which the AlGaN layer 104 is etched beneath the control electrode 108 in the present embodiment. Nevertheless, it may also be preferred that the AlGaN layer 104 is etched to become thinner to some extent. For example, similar to FIG. 7 which shows a conventional FET, the insulating film 105, the charge storage layer 106 and so forth may be buried into the recess etching portion formed in the AlGaN layer 104. Even in this case, the residual thickness of the AlGaN layer 104 may be sufficient to suppress the dispersion of cell characteristics such as threshold voltage, etc. The influence of trap levels may also be avoided.

FIG. 3 is the horizontal projection and the cross-sectional views along A-A' and B-B' of the FET, which is an example of the first embodiment. FIG. 1 corresponds to the A-A' cross-section from the source electrode 109 to the drain electrode 110 in FIG. 3. In the horizontal projection, the area of the AlGaN layer 104 is the cell area of the FET, where the rest is the cell isolation region 116. As shown in FIG. 3, the AlGaN layer 104 is removed for forming the cell isolation, but the GaN layer 103 and/or the buffer layer 102 may also be removed simultaneously. Furthermore, it may also be preferred to electrically inactivate the GaN layer 103 and/or the buffer layer 102 by ion implantation. Alternatively, it may also be preferred to electrically inactivate the AlGaN layer 104 as well as the GaN layer 103 and/or the buffer layer 102 by the ion implantation without removing the AlGaN layer 104. The cell isolation method of other embodiments to be mentioned below may be similar to the above. In order to suppress leakage between the source and drain electrodes 109 and 110 of the FET, the ends of the charge storage layer 106 extend to the cell isolation region 116, as shown in the B-B' cross-sectional view. However, the area that the charge storage layer 106 overlaps with the cell isolation region 116 may be sufficiently smaller than that of the charge storage layer 106 above the cell region (AlGaN layer 104). Accordingly, the capacitance between the cell isolation region 116 and the charge storage layer 106 is small enough to be ignorable compared with the capacitor 113 between the charge storage layer 106 and the AlGaN layer 104 in the cell region.

The nitride semiconductor FET in the present embodiment may be promising not only for power switching devices to be used in a power supply circuit, etc., but also for high frequency transistors. In this embodiment, the control electrode 108 may be identical to the electrode, usually called a gate electrode, in the high frequency transistors. Since the FET is normally-off, that is, executes the enhancement type operation, both voltages to be applied to the gate electrode and the drain electrode can be positive. Thereby, the transistor may be able to be operated with a positive single power supply, thus simplifying the electric supply source. Furthermore, the AlGaN layer 104 beneath the control electrode 108 serving as the gate electrode can be made thick to suppress the dispersion of the threshold voltage due to the thickness variation. In addition, since the transistor is less affected by the trap levels existing at the interface of the insulating film 105 and the AlGaN layer 104, the high frequency transistor, which is excellent in the properties such as the trans-conductance, the maximum drain current and so forth, may be obtained.

Figure 4A:
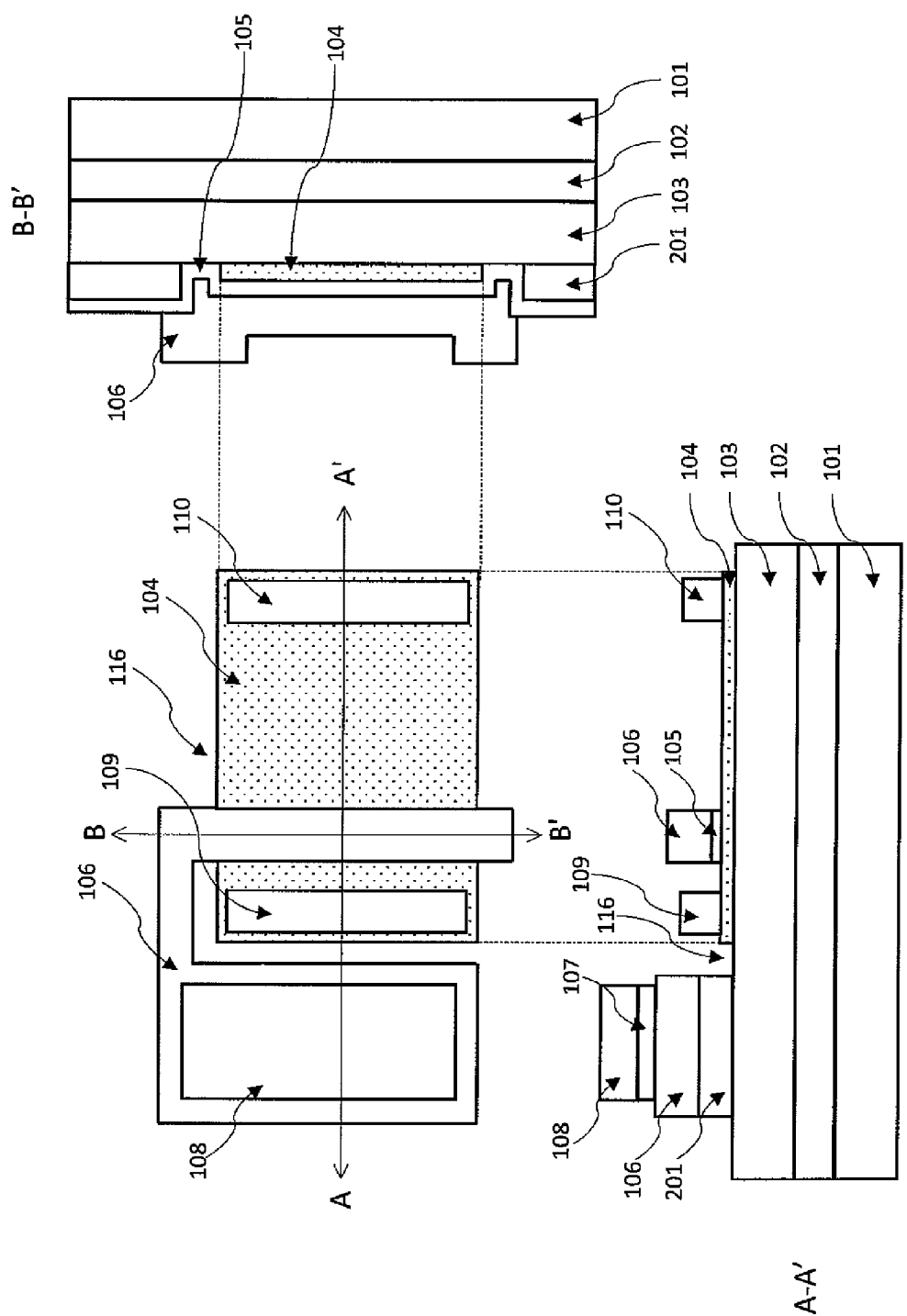
FIG. 4(a) shows a horizontal projection and a cross-sectional view of a FET in the second embodiment.
Figure 4B:
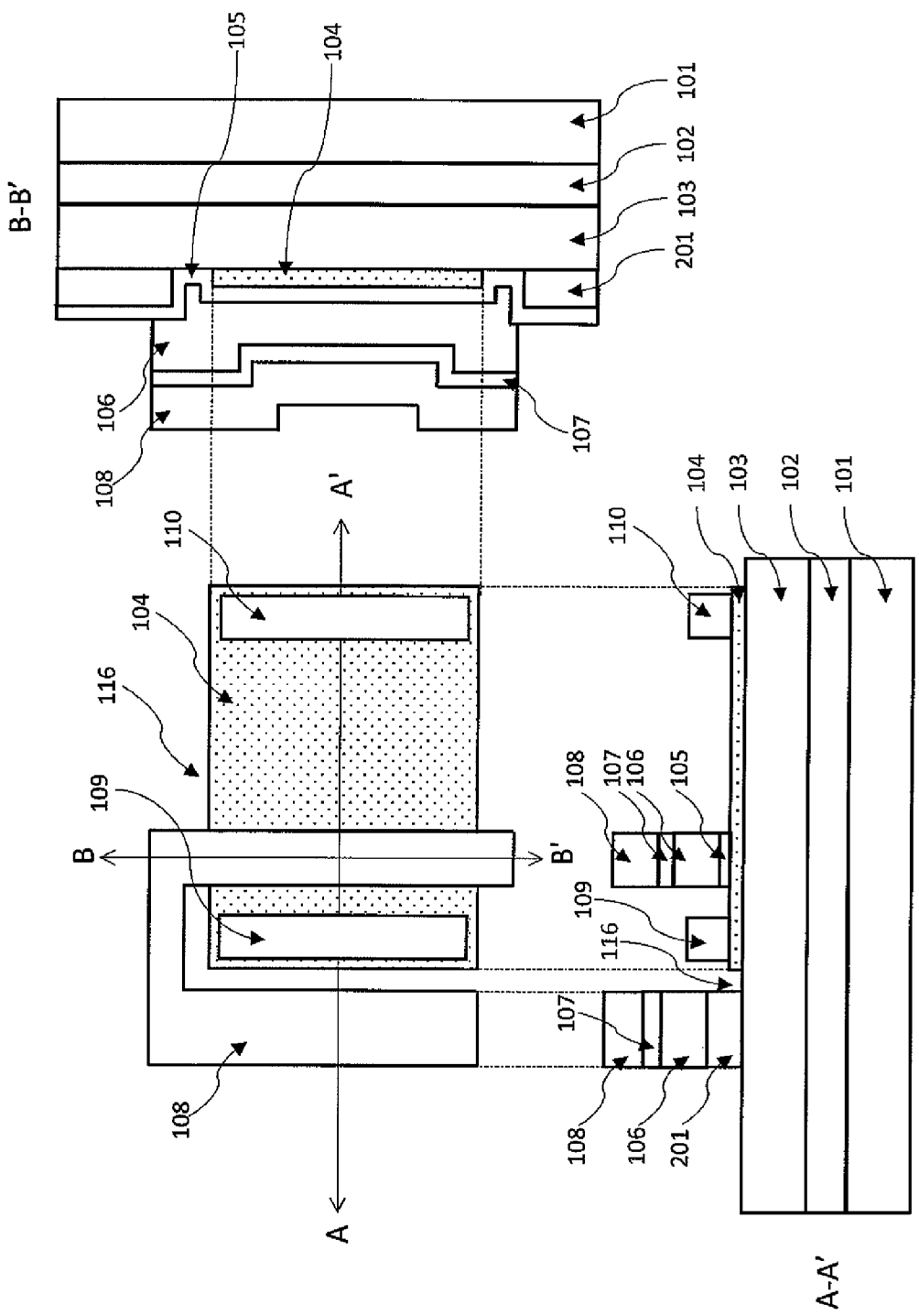
FIG. 4(b) shows a horizontal projection and a cross-sectional view of a FET in the third embodiment.
Figure 4C:
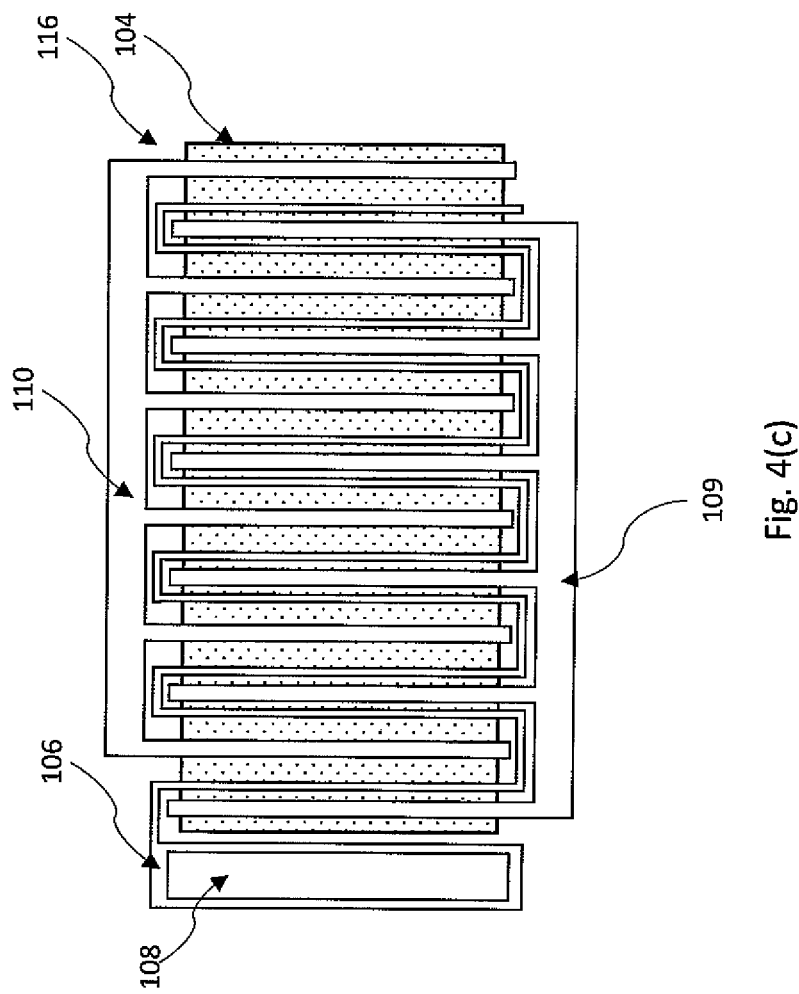
FIG. 4(c) is a horizontal projection of a FET in the fourth embodiment.
Figure 4E:
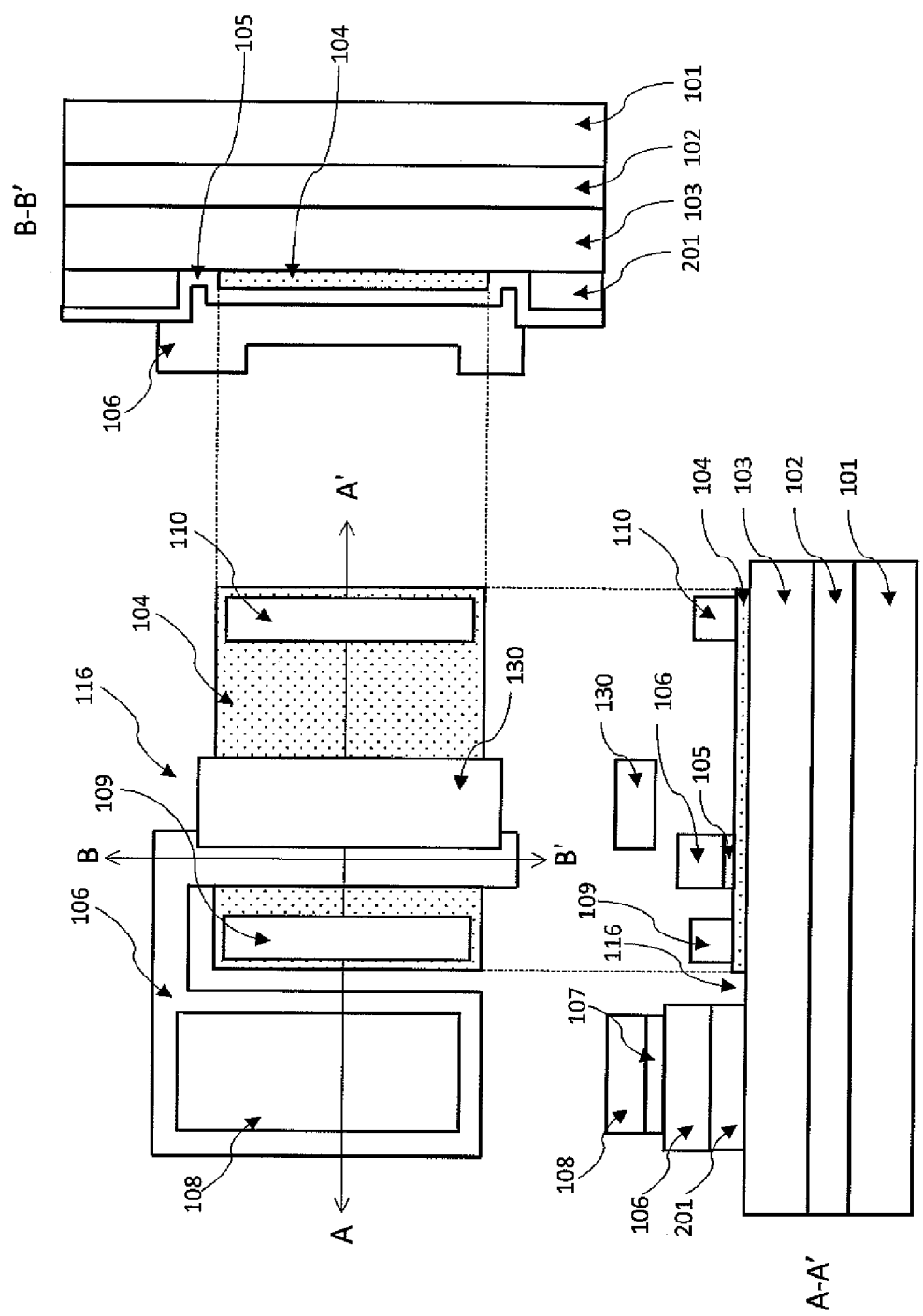
FIG. 4(e) shows a horizontal projection and a cross-sectional view of a FET in the sixth embodiment.
Figure 4F:
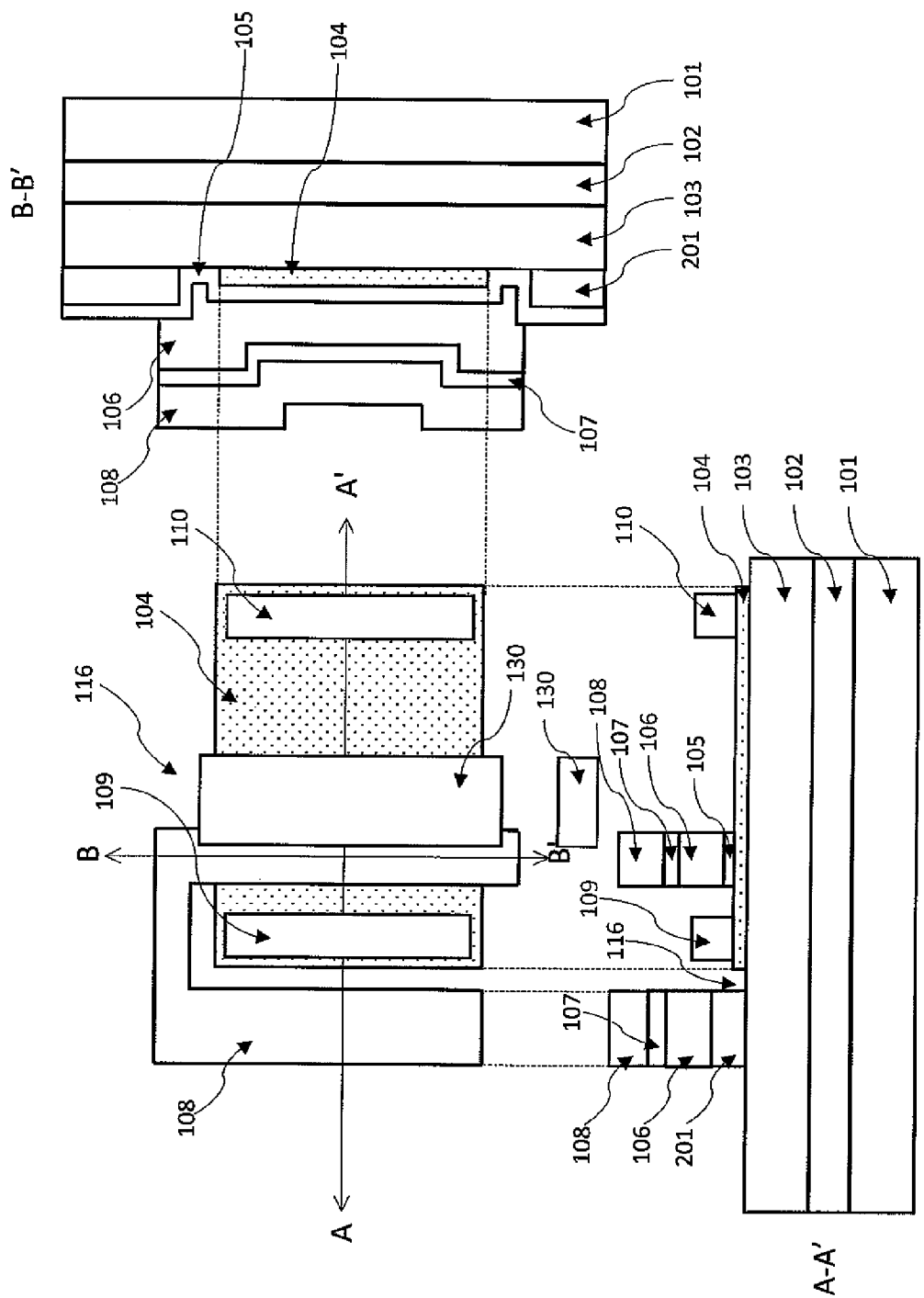
FIG. 4(f) shows a horizontal projection and a cross-sectional view of a FET in the seventh embodiment.

FIG. 4(a) shows the horizontal projection and the cross-sectional views along A-A' and B-B' of the FET, which is an example of the second embodiment. The present embodiment also belongs to the invention of the present disclosure. In the horizontal projection, similar to the first embodiment, the area of the AlGaN layer 104 is the cell area of the FET, and the rest is the cell isolation region 116. The majority of the charge storage layer 106 inside the cell isolation region 116 may exist above an insulating film 201 on the GaN layer 103. The insulating film 201 on the GaN layer 103 may be thicker than the insulating film 105. Thus, the capacitance of the insulating film 201 per unit area is smaller than that of the insulating film 105, where the capacitance of the insulating film per unit area is defined by the dielectric constant and the thickness of the insulating film. Thereby, the parasitic capacitance between the charge storage layer 106 and the GaN layer 103 in the cell isolation region may become sufficiently smaller than the capacitor 113 formed between the charge storage layer 106 and the AlGaN layer 104 in the cell region. In addition, the insulating film 107 and the control electrode 108 may be in turn stacked above the charge storage layer 106 in the cell isolation region 116. Accordingly, the capacitor 114 may be formed between the charge storage layer 106 and the control electrode 108. Similar to the first embodiment, the capacitor 114 is larger in capacitance than in the capacitor 113. Thus, the on-resistance and on-current may be more easily controlled by the control electrode 108.

The capacitance of the capacitor 114 is in proportion to the overlapping area of the charge storage layer 106 and the control electrode 108. Thus, the electrostatic capacitive-coupling is able to be strengthened between the charge storage layer 106 and the control electrode 108, if the overlapping area is widened to enlarge the capacitance of the capacitor 114. Accordingly, the insulating film 107 may not be necessarily a high permittivity material, which is different from the case of the first embodiment. For example, silicon oxide or a multilayer of three films of silicon oxide/silicon nitride/silicon oxide may be possibly used. Moreover, the physical thickness of the insulating film 107 may be larger than that of the insulating film 105. The configuration of the insulating 107 may be similar in other embodiments.

Furthermore, for the charge storage layer 106, polycrystalline silicon doped with impurities may be used as well as metallic layers. In that case, the impurities may be phosphorus, arsenide, boron and so forth.

In the second embodiment mentioned above, the bottom electrode of the capacitor 114 configured in the cell isolation region is made of the charge storage layer 106 extending from the cell region. However, a bottom electrode may be made of a low resistive layer which is different from the charge storage layer 106. In this case, the low resistive layer may be electrically connected to the charge storage layer 106 directly or connected indirectly via another low resistive layer.

The method of injecting electrons to the charge storage layer 106 may be similar to that of the first embodiment.

FIG. 4(*b*) is a drawing illustrating the horizontal projection and the cross-sectional views along A-A' and B-B' in the third embodiment. Different from the second embodiment, the insulating film 107 and the control electrode 108 are stacked above the entire surface of the charge storage layer 106. Similarly to the second embodiment, a main part of the charge storage layer 106 in the cell isolation region 116 is formed over the insulating film 201 except for the closest vicinity of the cell region. Thus, the parasitic capacitance between the charge storage layer 106 in the cell isolation region 116 and the GaN layer 103 becomes sufficiently smaller than the capacitance of the capacitor 113 between the charge storage layer 106 in the cell region and the AlGaN layer 104. In addition, the overlapping area of the charge storage layer 106 and the control electrode 108 is sufficiently larger than the overlapping area of the charge storage layer 106 in the cell region and the AlGaN layer 104. Therefore, even though the insulating film 107 is thicker than the insulating film 105, the capacitance of the capacitor 114 is able to be larger than that of the capacitor 113. The other features may be similar to those in the second embodiment.

FIG. 4(*c*) is a drawing illustrating the horizontal project of the fourth embodiment. The basic structure of the cell in the present embodiment is the same as that of the second embodiment shown in FIG. 4(*a*). However, the source and drain electrodes 109 and 110 are configured by a plurality of fingers in the present embodiment. The charge storage layer 106 is meanderingly laid between the fingers of the source and drain electrodes 109 and 110. This layout design enables large current switching. The capacitor 114 comprising the charge storage layer 106 and the control electrode 108 is configured over the cell isolation region 116 similar to the second embodiment. Furthermore, the configuration related to the area of the capacitor 114, the thickness and material of the insulating film 107, etc., are also similar to those described for the second embodiment.

In the fourth embodiment shown in FIG. 4(*c*), the capacitor 114 configured in the cell isolation region is formed of the charge storage layer 106 extending from the cell region, which serves as the bottom electrode of the capacitor. However, it may also be preferred that the bottom electrode is made of a low resistive layer different from the charge storage layer 106. In this case, the low resistive layer may be electrically connected to the charge storage layer 106 directly, or connected indirectly via another low resistive layer.

The capacitor 114 may also be three-dimensionally stacked above the cell region. In that case, a portion of the cell isolation region to be occupied by the capacitor 114 is saved. Therefore, the total size of the cell can be miniaturized. In addition, the capacitor 114 may also be replaced with an externally equipped capacitor outside the substrate 101 on which the cell is fabricated. In this case, the area of the cell to be fabricated on the substrate 101 may also be reduced.

FIG. 4(*d*) is a drawing illustrating the horizontal projection of the fifth embodiment of the present disclosure. The basic structure of the cell in the present embodiment is the same as that of the third embodiment shown in FIG. 4(*b*). However, the source and drain electrodes 109 and 110 are configured by a plurality of fingers in the present embodiment. The charge storage layer 106 and the control electrode 108 are meanderingly laid between the fingers of the source and drain electrodes 109 and 110. This layout design enables large current switching. The insulating film 107 and the control electrode 108 are stacked on the entire surface of the charge storage layer 106 similar to the third embodiment. Furthermore, even if the insulating film 107 is thicker than the insulating film 105, the capacitance of the capacitor 114 is larger than that of the capacitor 113. This is also similar to the third embodiment.

FIG. 4(*e*) is a drawing illustrating the sixth embodiment of the present disclosure. This embodiment is obtained by adding a field plate 130 to the second embodiment shown in FIG. 4(*a*). The other part is the same as the second embodiment. The field plate 130 is almost the same in potential as the source electrode 109, and suppresses concentration of the electric field on the drain side edge of the charge storage layer 106 even when a high voltage is applied to the drain electrode 110 during the stand-by with the voltage applied to the control electrode 108 being 0 V. Consequently, it restrains the potential difference from being locally enhanced between the charge storage layer 106 and the AlGaN layer 104. Then, the stored charge 115 may hardly leak from the charge storage layer 106. Thus, the aging change of the threshold voltage may be suppressed.

FIG. 4(*f*) is a drawing illustrating the seventh embodiment. In the present embodiment, a field plate 130 is added to the third embodiment shown in FIG. 4(*b*). The rest is the same as the third embodiment. The field plate 130 is almost the same in potential as the source electrode 109. This suppresses concentration of the electric field on the drain side edge of the charge storage layer 106 even when a high voltage is applied to the drain electrode 110 during the stand-by with the voltage to be applied to the control electrode 108 being 0V. Consequently, it restrains the potential difference from being locally enhanced between the charge storage layer 106 and the AlGaN layer 104. Then, the stored charge 115 may hardly leak from the charge storage layer 106. Thus, the aging change of threshold voltage may be suppressed.

FIG. 5(a) is a drawing illustrating the eighth embodiment. This embodiment is that of the invention of the present disclosure. The buffer layer 102, the GaN layer 103, and the AlGaN layer 104 are in turn grown on the substrate 101. The substrate 101 and the buffer layer 102 may be made of the same materials as those in the prior art shown in FIG. 7. Next, the insulating film 117, the charge storage insulating film 118, and the insulating film 119 may be in turn deposited on the AlGaN layer 104, and, then, the control electrode 108 is formed over them. Furthermore, the source and drain electrode 109 and 110 are formed on the AlGaN layer 104. It is preferred that the thickness of the AlGaN layer 104 is 10 nm or more on both sides of the control electrode 108 between the source electrode 109 and the control electrode 108, and between the drain electrode 110 and the control electrode 108. A sufficient quantity of conduction electrons may be induced in a conductive channel 111 at the interface AlGaN/GaN to reduce the resistivity of those regions. It may be preferred to tune the alloy composition in the AlGaN layer 104, that is, the value of x in the chemical formula AlxGa1−xN, in order to avoid an excessive relaxation of the lattice in AlGaN having the lattice constant different from GaN. Usually, x may be ranging from 0.1 to 0.4. The charge storage insulating film 118 may be made of a material having a band gap smaller than that of the insulating films 117 and 119 that sandwich the charge storage insulating film 118 and/or having a plurality of traps whose energy levels are inside the band gap of the insulating films 117 and 119. Accordingly, it stores a sufficient quantity of charge in the charge storage insulating film 118, and the charge once having been stored in the charge storage insulating film 118 may hardly leak.

As shown in FIG. 5(b), the threshold voltage of FETs is determined by the stored charge in the charge storage insulating film 118. The threshold voltage becomes higher as more negative charges are stored. Accordingly, the threshold voltage may be able to be more than 3V if a certain quantity of the negative charge is stored in the charge storage insulating film 118. Thus, an FET with a sufficient normally-off state is obtained.

Figure 5C:
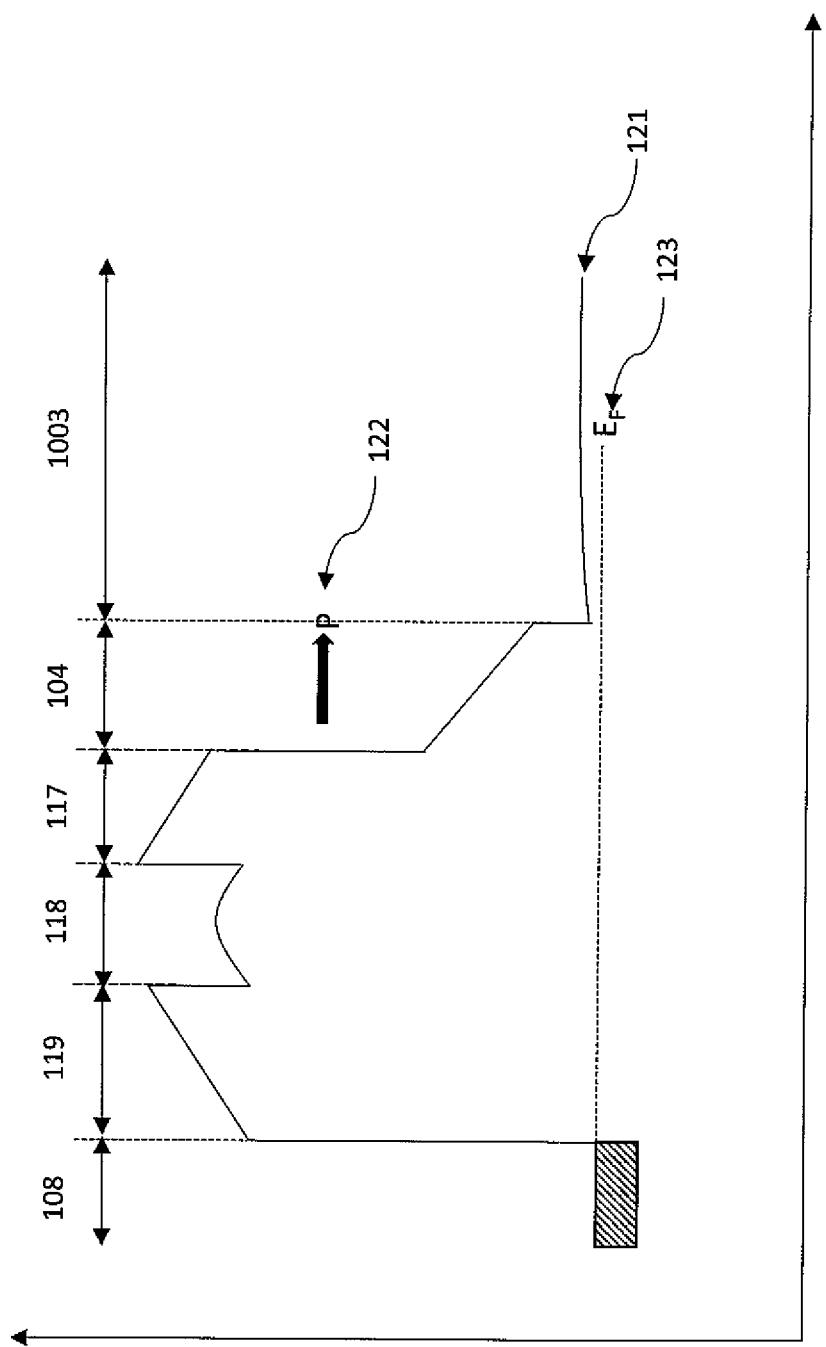
FIG. 5(c) is a band diagram of the FET in the eighth embodiment.

FIG. 5(c) is a drawing illustrating the band diagram of insulating films and semiconductor layers beneath the control electrode 108. In this band diagram, no voltage is applied to the control electrode 108. In the case that a sufficient quantity of negative charge is stored in the charge storage film 118, the potential energy of the charge storage insulating film 118 is elevated, and the conduction band edge 121 of the GaN layer 103 becomes higher in energy than the Fermi level (EF) 123 at the interface between the AlGaN layer 104 and the GaN layer 103. Accordingly, the conduction electrons are restrained from being induced there. That is, the threshold voltage may be positive as shown in FIG. 5(b).

Figure 5D:
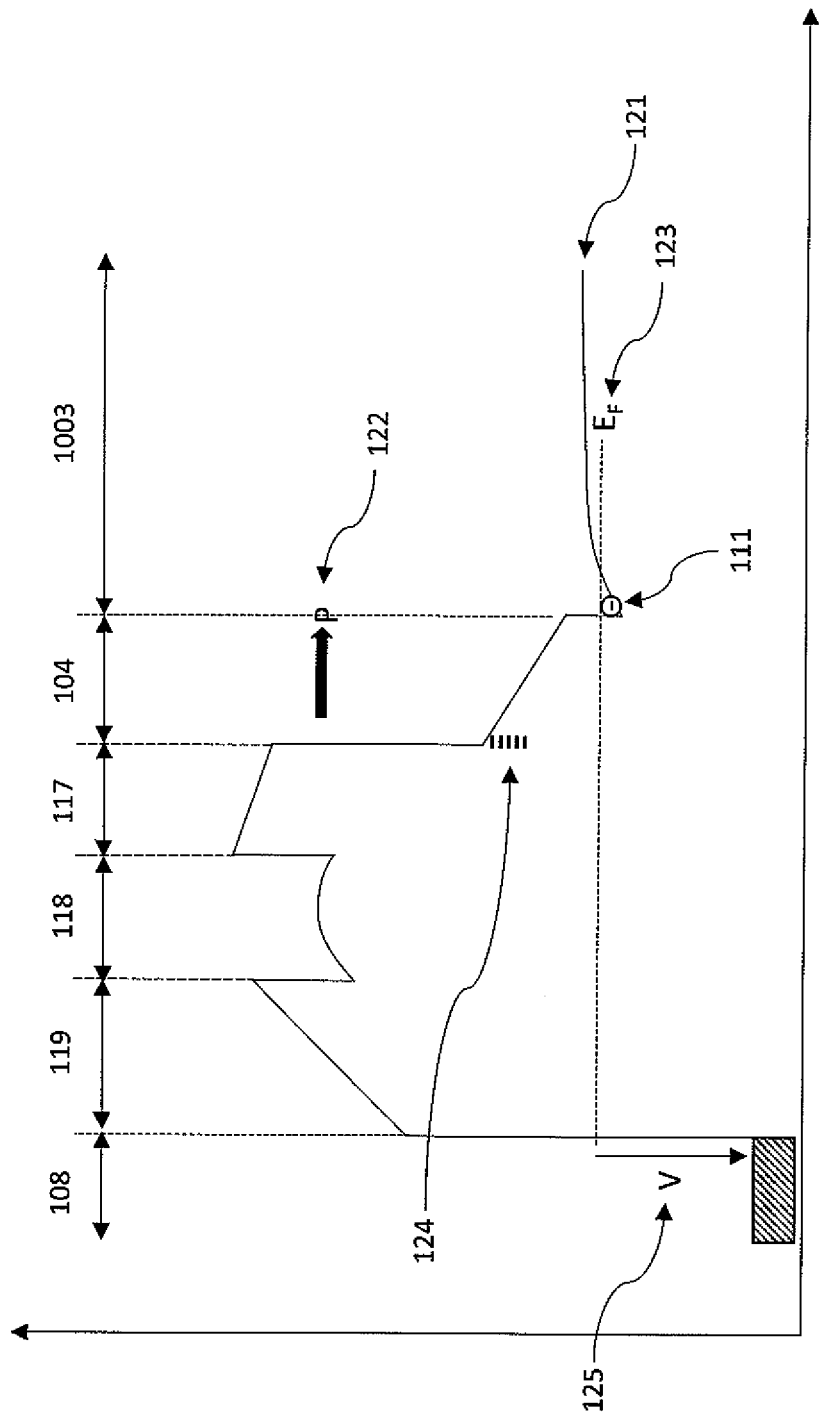
FIG. 5(d) is a band diagram of the FET in the eighth embodiment.

FIG. 5(d) is a drawing illustrating the band diagram where a positive gate voltage 125 (labeled V in the figure) is applied to the control electrode 108. The conduction band edge 121 is below the Fermi level 123 at the interface between the AlGaN layer 104 and the GaN layer 103. If conduction electrons are induced there, the electric current may flow through the conductive channel 111.

In the present embodiment, the transistor may be made normally-off by storing the negative charge in the charge storage insulating film 118 without thinning a portion of the AlGaN layer 104 to form the control electrode 108. Therefore, it is free from a problem of the dispersion of cell characteristics such as threshold variation etc., like those in the prior art due to the residual thickness dispersion after etching the AlGaN layer 104. Furthermore, as shown in FIG. 5(d), the trap levels 124 are above the Fermi level 123 at the interface between the insulating film 117 and the AlGaN layer 104 because the AlGaN layer 104 is sufficiently thick in the portion under the control electrode 108. This may prevent the hindrance of inducing conduction electrons in the conductive channel 111 by applying a voltage to the control electrode 108 from happening.

In the present embodiment, the AlGaN layer 104 is not etched under the control electrode 108. However, it may also be preferred that the AlGaN layer 104 is etched to become thinner to some extent. For example, analogically to FIG. 7, which is a prior art, the insulating film 117, the charge storage insulating film 118, the insulating film 119, the control electrode 108 and so forth may be buried in the recessed etching portion formed in the AlGaN layer 104. Even in this case, the residual thickness of the AlGaN layer 104 may be sufficient to suppress the dispersion of cell characteristics such as threshold voltage, etc. The influence of trap levels may also be avoided.

A method of injecting the negative charge into the charge storage insulating film 118 is that a positive or negative voltage is applied to the control electrode 108 while the potentials of the source and drain electrodes 109 and 110 are 0V. Thus, high potential differences are given between the control electrode 108 and the source and drain electrodes 109 and 110. If the control electrode 108 is highly positive in potential, electrons in the AlGaN layer 104 may be able to tunnel through the insulating film 117 above the AlGaN layer and be injected into the charge storage insulating film 118. Alternatively, if the control electrode 108 is sufficiently negative in potential, electrons may be able to tunnel from the control electrode 108 to the charge storage insulating film 118. The charge storage insulating film 118 is covered by the insulating films 117 and 119, and electrons stored therein may also be trapped by the charge traps whose energy levels are inside the band gap of both insulating films 117 and 119. Thus, those electrons having been once trapped may not leak and thus be stored therein. As shown in FIG. 5(b), the threshold voltage may be positive if the quantify of the stored charge in the charge storage insulating film 118 exceeds a certain value. Thus, a normally-off FET is obtained.

Another method of injecting the negative charge into the charge storage insulating film 118 is that the FET is turned on by giving a certain positive potential to the control electrode 108 while the source electrode is given 0 V and while a certain positive potential is given to the drain electrode 110. Thus, some of the electrons transporting through the conductive channel 111 may attain high energy at the edge portion of the control electrode 108 on the drain electrode 110 side, where the horizontal electric field becomes high enough. A portion of those high energy electrons may change their direction of transport due to scattering with GaN inside the conductive channel 111 and be injected to the charge storage insulating film 118 through the surface of AlGaN 112 and the insulating film 117. This process may be repeated in the opposite direction, i.e. the drain electrode 110 is given 0 V and the source electrode 109 is given a certain positive voltage, while the control electrode 108 is positive in potential. Thus, the FET is turned on. In a similar manner, high energy electrons may be injected to the charge storage insulating film 118 at the edge of the control electrode 108 on the source electrode 109 side. If the quantity of injected electrons in the charge storage insulating film 118 exceeds a certain value, the threshold voltage becomes positive. Then, a normally-off FET may be obtained. The above mentioned electron injection scheme may be performed either on the source side, the drain side, or both sides.

The charge storage insulating film 118 may be, for example, silicon nitride. The insulating films 117 and 118 may be, for example, silicon oxide. The silicon nitride has the plurality of charge traps, and the energy levels of those traps are inside the band gap of the silicon oxides sandwiching the silicon nitride. The insulating film 117 may also be preferred to be a multilayer of a plurality of different types of insulating films. For example, it may be a multilayer of aluminum oxide and silicon oxide, or a multilayer of silicon nitride and silicon oxide.

Another method of injecting the charge to the charge storage insulating film 118 is that the surface of FET is irradiated by a light. The light may penetrate through the control electrode 108, the insulating film 119, the charge storage insulating film 118, and the insulating film 117, and reach the interface between the AlGaN layer 104 and the GaN layer 103. In the case that a positive high voltage is given to the control electrode 108, electrons in the GaN layer 103 may absorb the light energy that increases the injection rate from the GaN layer 103 to the charge storage insulating film 118. Similarly, in the case that a negative potential is given to the control electrode 108, the control electrode 108 is irradiated with the light which is absorbed by electrons in the control electrode 108. Thus, the rate for those electrons to be injected from the control electrode 108 to the charge storage insulating film 118 may increase. In the case that the electron injection is executed after package sealing, a portion of the package may be formed of a transparent component, through which the light is irradiated.

The nitride semiconductor FET of the present embodiment is promising as a power switching device to be used in the power supply circuits, etc., and is also preferably used as a high frequency transistor. In this embodiment, the control electrode 108 is identical to the electrode, usually called a gate electrode in high frequency transistors. The FET is normally-off, that is, executes the enhancement type operation. Then, voltages applied to the gate and drain electrodes are both positive. Thus, the transistors may be able to operate with a positive single power supply, and the power supply is simplified. Furthermore, since the AlGaN layer 104 under the control electrode 108 (serving as the gate electrode) is thick, the dispersion of the threshold voltage is small. In addition, the trap levels 124 at the interface between the insulating film 117 and the AlGaN layer 104 become less influential. Consequently, a high frequency transistor, which is excellent in trans-conductance, maximum drain current, etc., may be obtained.

Figure 5E:
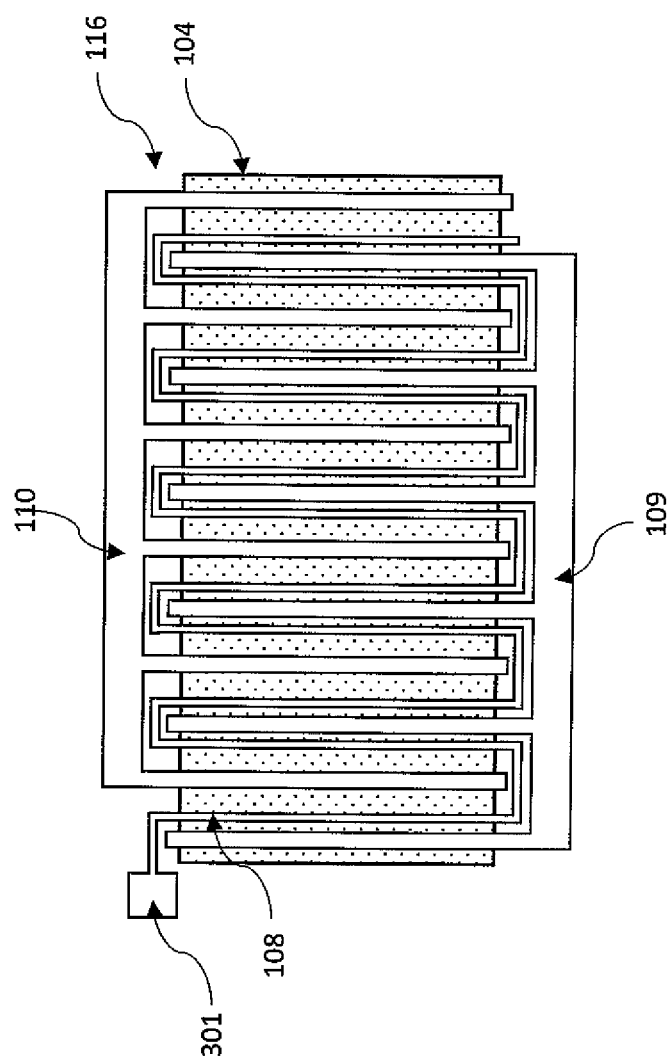
FIG. 5(e) is a horizontal projection of the FET in the eighth embodiment.

FIG. 5(e) is a drawing illustrating the horizontal projection of the FET which is an example of the eighth embodiment shown in FIG. 5(a). The source and drain electrodes 109 and 110 are configured by a plurality of fingers. The control electrode 108 is laid meanderingly between those fingers of the source and drain electrodes 109 and 110. This configuration enables the large current switching operation. The control electrode 108 is connected to a control voltage supplying pad 301 located in the cell isolation region 116.

Figure 5F:
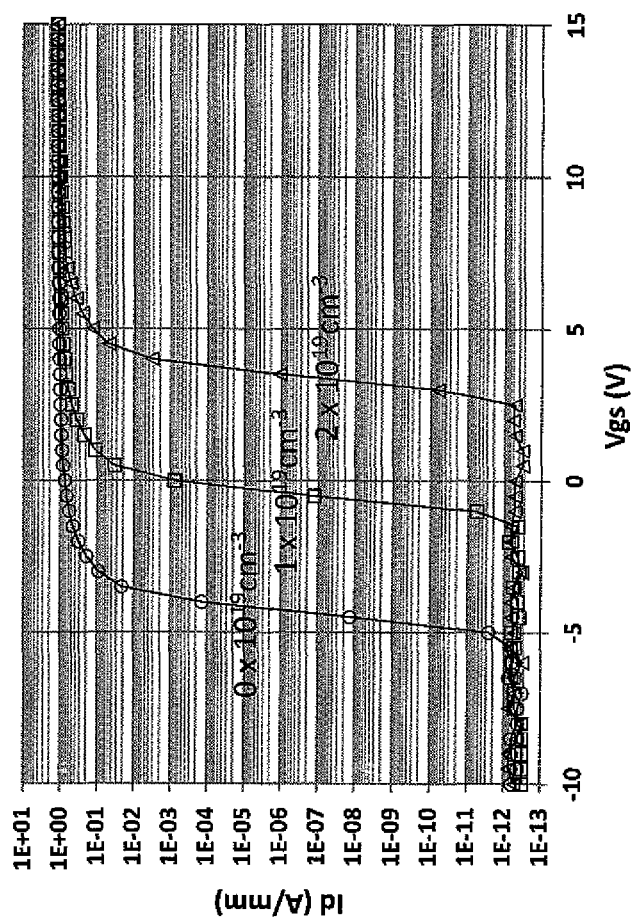
FIG. 5(f) is a diagrammatic view of electrical characteristics of the FET in the eighth embodiment.
Figure 5G:
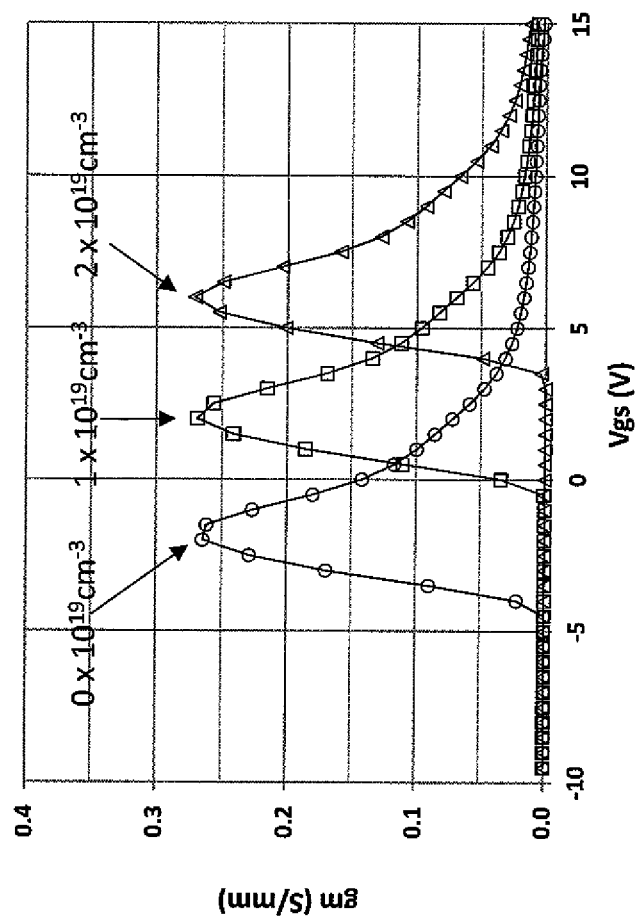
FIG. 5(g) is a diagrammatic view of electrical characteristics of the FET in the eighth embodiment.

FIG. 5(f) is the 2-dimensional device simulation result that shows the gate voltage (Vgs) dependence of the drain current (Id) in the FET according to the eighth embodiment shown in FIG. 5(a). The drain voltage Vds is 10V. The gate length of the control electrode 108 is 1 µm. The distance between the source and control electrodes 109 and 108 is 1 µm. The distance between the control and drain electrodes 108 and 110 is 10 µm. This asymmetric configuration is for improving the breakdown voltage of the cell in the case that a high voltage is applied to the drain electrode 110 during stand-by where the control electrode 108 is 0 V. The insulating film 117 is silicon oxide with the thickness being 10 nm. The charge storage insulating film 118 is silicon nitride with the thickness being 5 nm. The insulating film 119 is silicon oxide with the thickness being 15 nm. The negative charge stored in the charge storage insulating film 118 is assumed to be homogenously distributed inside the film. In addition, the AlGaN layer 104 is 10 nm in thickness. The alloy composition ratio, i.e., x, in the chemical formula $Al_xGa_{1-x}N$ is assumed to be 0.3. The three curved lines shown in FIG. 5(f) are plots with a negative charge density of the insulating film 118 being $0 \times 10^{19}$ cm−3, $1 \times 10^{19}$ cm−3, and $2 \times 10^{19}$ cm−3, respectively, from the left. In the case that the negative charge is zero in the charge storage insulating film 118, it is shown that the threshold voltage of the transistor is about −5 V, and the transistor shows the normally-on characteristic. However, the threshold voltage moves toward the positive direction as the negative charge density in the charge storage insulating film 118 is increased. At $2 \times 10^{19}$ cm−3, the threshold voltage is about 3V, and a sufficient normally-off characteristic is realized. FIG. 5(g) is a plot of gate voltage (Vgs) dependence of transconductance ($\Delta Id/\Delta Vg$=gm). The threshold voltage moves toward the positive direction with no reduction of gm peak as the negative charge is stored in the charge storage insulating film 118. Therefore, a normally-off transistor can be obtained with no degradation of the basic properties.

Figure 5H:
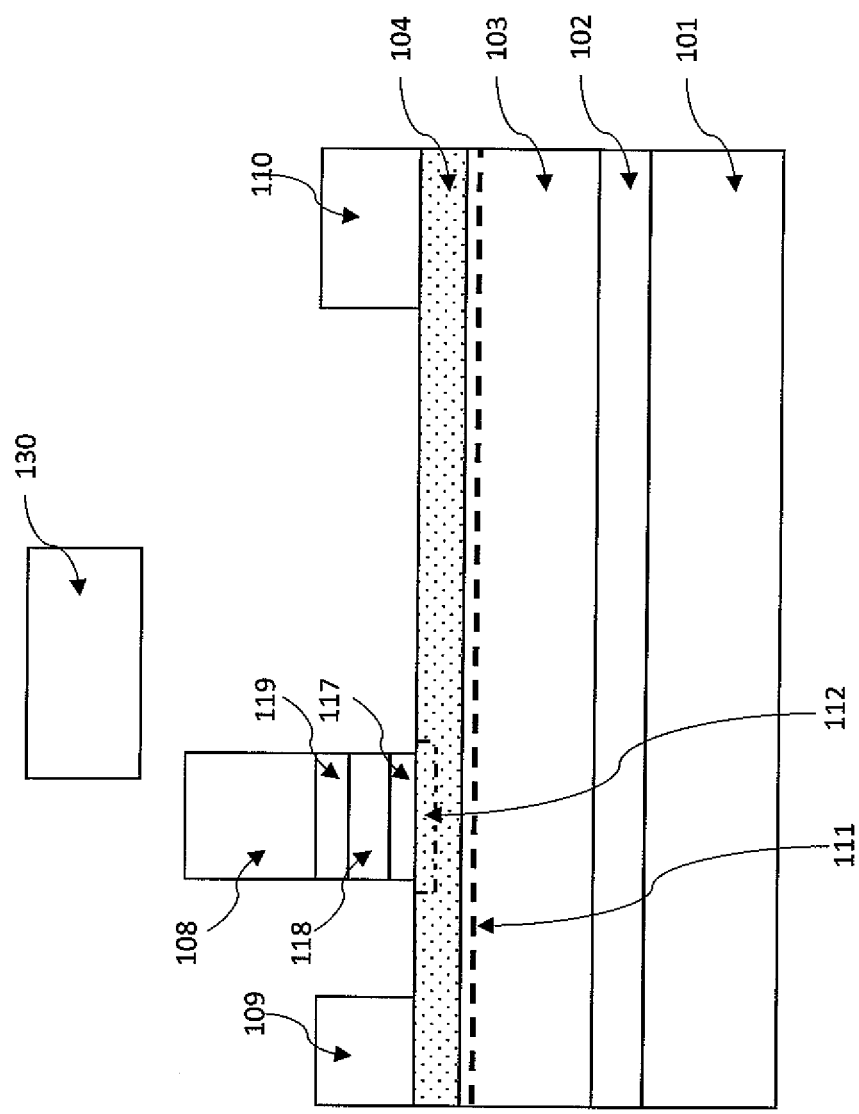
FIG. 5(h) is a cross-sectional view of a FET in the ninth embodiment.

FIG. 5(h) shows the ninth embodiment. This embodiment is obtained by adding a field plate 130 to the eighth embodiment shown in FIG. 5(a). In addition, the distance between the control electrode 108 and the drain electrodes 110 may be longer than that between the control electrode 108 and the source electrode 109 to improve the breakdown voltage between the control electrode 108 and the drain electrode 110. The rest may be the same as that shown in the eighth embodiment. The field plate 130 is assumed to be almost the same in potential as the source electrode 109. Accordingly, even when a high voltage is applied to the drain electrode 110 during stand-by where the control electrode 108 is given 0 V, the field concentration at the drain edge of the charge storage insulating film 118 is suppressed. Consequently, the stored charge hardly leaks from the charge storage insulating film. Thus, the aging change of the threshold voltage is significantly reduced.

Figure 6A:
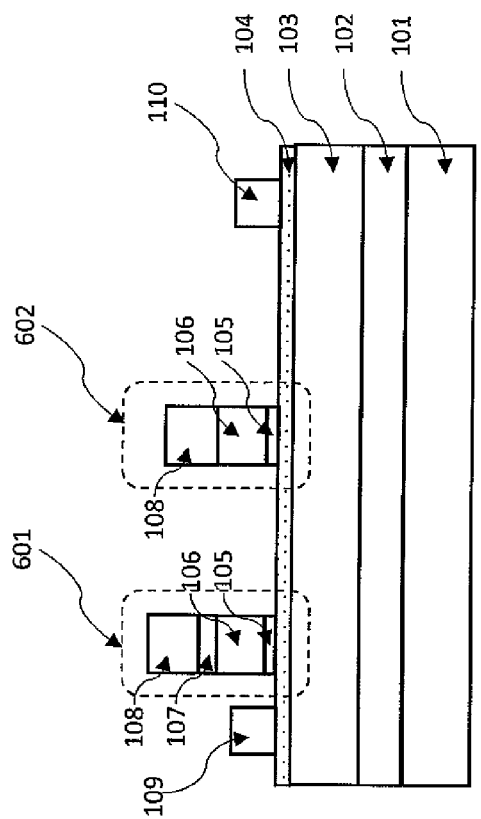
FIG. 6(a) is a cross-sectional view of a FET in the tenth embodiment.
Figure 6B:
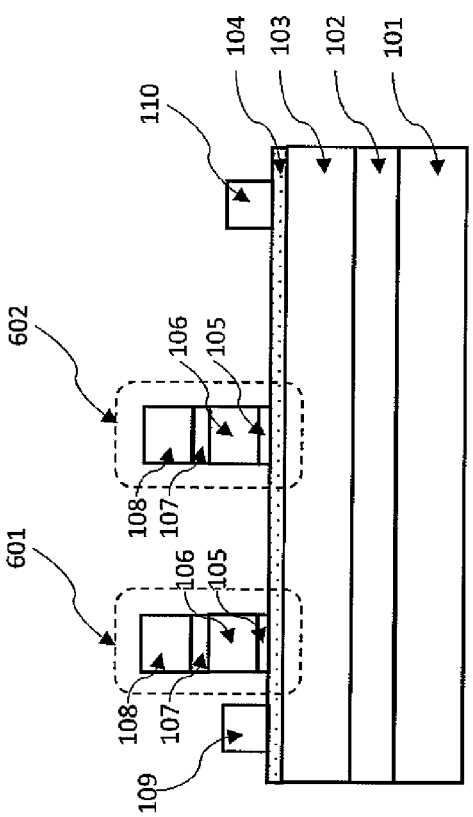
FIG. 6(b) is a cross-sectional view of a FET in the eleventh embodiment.
Figure 6C:
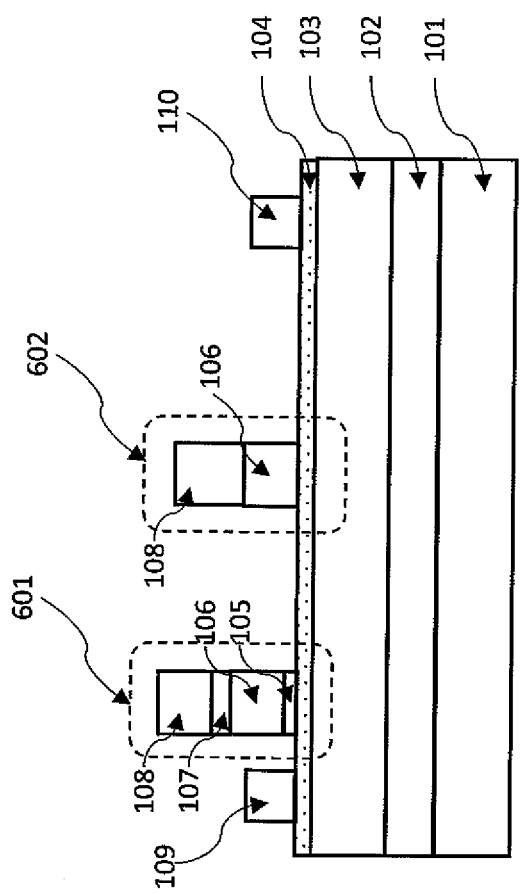
FIG. 6(c) is a cross-sectional view of a FET in the twelfth embodiment.
Figure 6D:
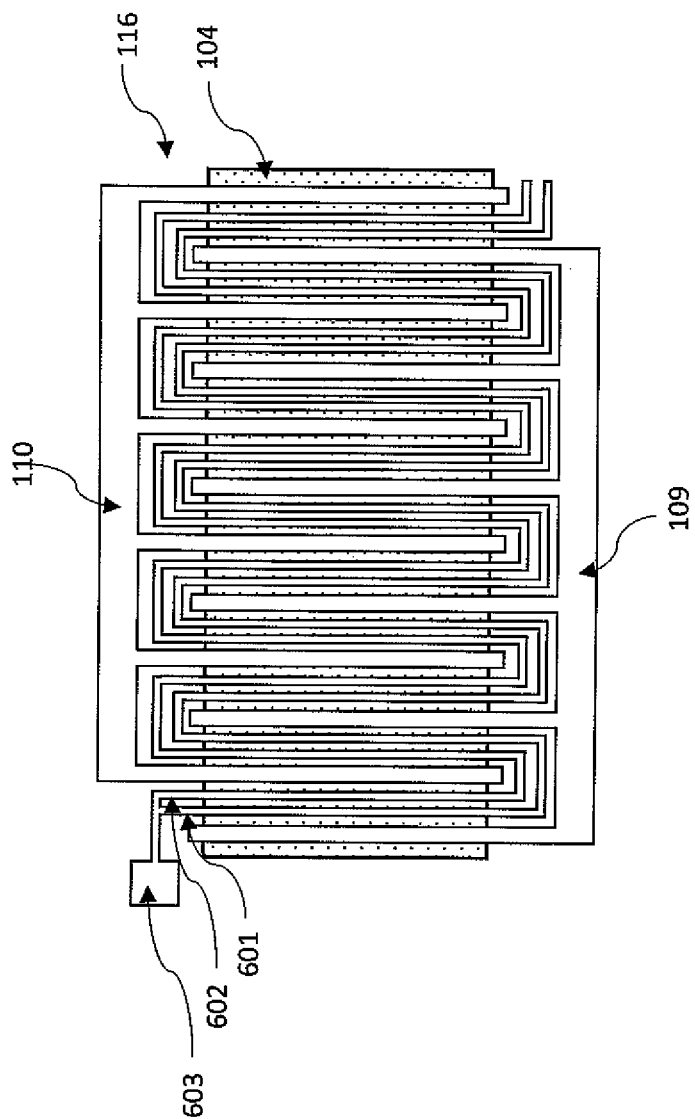
FIG. 6(d) shows a horizontal projection of the FETs in the tenth to twelfth embodiments.
Figure 6E:
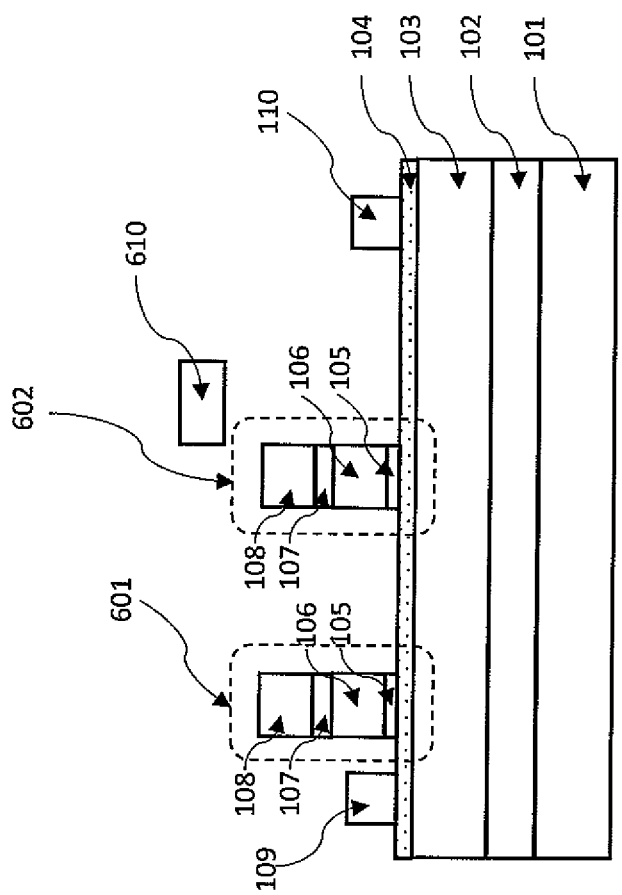
FIG. 6(e) is a cross-sectional view of a FET in the thirteenth embodiment.

FIG. 6(a) shows the tenth embodiment. FIG. 6(a) is the cross-sectional view of the cell region, where two FETs 601 and 602 are arrayed in series on a same cell region on the AlGaN layer 104. The source electrode 109 adjoins the FET 601, and the drain electrode 110 adjoins the FET 602. Those FETs 601 and 602 are made of the same materials and are formed in the similar manner as that of the first and third embodiments. FIG. 6(a) is a drawing illustrating the case in which FET 601 and FET 602 are formed according to the first embodiment. Here, in FET 601, the threshold voltage is made positive by sufficiently storing the negative charge 115 to the charge storage layer 106. In the FET 602, the threshold voltage is negative by insufficiently storing the negative charge 115 to the charge storage layer 106. In addition, two gate electrodes 108 are given the same or almost the same potentials. By serially connecting those FETs, the potential of the AlGaN layer 104 is lowered between the FET 602 and the FET 601 even when a high voltage is applied to the drain electrode 110 during stand-by where the gate electrode 108 is 0 V. Accordingly, there is no excessive potential difference between the charge storage layer 106 of the FET 601 and the AlGaN layer 104 underneath. This makes it difficult for the stored charge 115 to leak from the charge storage layer 106 and thus suppresses the aging change of the threshold voltage.

In the tenth embodiment shown in FIG. 6(*a*), the configuration of the FET 601 and the FET 602 may be made similar to that of the eighth embodiment. In this embodiment, the charge storage layer 106 of the FET 601 and the FET 602 are replaced with the charge storage insulating film 118. Then, in the FET 601, a sufficient quantity of the negative charge is stored in the charge storage insulating film 118 to make the threshold voltage positive. Additionally, in the FET 602, an insufficient quantity of the negative charge is stored in the charge storage insulating film 118 to make the threshold voltage of the FET 602 negative. In this case, by serially connecting the two FETs, the stored charge hardly leaks from the charge storage insulating film 118 of the FET 601.

FIG. 6(*b*) illustrates the eleventh embodiment. FIG. 6(*b*) is the cross-sectional view in the cell region, where two FETs 601 and 602 are serially arrayed in a same cell region on the AlGaN layer 104. The source electrode 109 adjoins the FET 601, and the drain electrode 110 adjoins the FET 602. The difference from the tenth embodiment is that the insulating film 107 does not exist in the FET 602, and the charge storage layer 106 and the control electrode 108 are electrically connected therein. The others are structurally identical to those in the tenth embodiment. The charge storage layer 106 under the control electrode 108 in the FET 602 may not serve as a floating gate. As a result, the voltage dependence of on-current is more easily controlled by the control electrode 108. In FIG. 6(*b*), the gate electrode of the FET 602 is configured of a metallic layer identical to the gate electrode of the FET 601, that is, the metallic layers where the charge storage layer 106 and the control electrode 108 are directly stacked. However, it may be also preferable that the gate electrode of the FET 602 is configured of a single metallic layer or of multi-metallic layers, which is different from the charge storage layer 106 and the control electrode 108.

In the eleventh embodiment shown in FIG. 6(*b*), it may also be preferred that the configuration of the FET 601 is similar to that of the eighth embodiment. In this embodiment, the charge storage layer 106 of the FET 601 is replaced by the charge storage insulating film 118. Then, a sufficient quantity of the negative charge may be stored there to make the threshold voltage positive. Additionally, in the FET 602, neither the charge storage layer 106 nor the charge storage insulating film 118 is adopted. Then, the control electrode 108 may be formed directly on the insulating film 105. Moreover, the control electrode 108 of the FET 602 may be formed of a metallic layer different from the control electrode 108 of the FET 601.

FIG. 6(*c*) shows the twelfth embodiment. FIG. 6(*c*) is the cross-sectional view in the cell region, where the two FETs 601 and 602 are serially arrayed in a same cell region on the AlGaN layer 104. The source electrode 109 adjoins the FET 601, and the drain electrode 110 adjoins the FET 602. The difference from the tenth and eleventh embodiments are that neither of the two insulating films 105 nor 107 exists in the FET 602. Additionally, the charge storage layer 106 and the control electrode 108 are electrically connected. The rest is structurally identical to those of the tenth and eleventh embodiments. The charge storage layer 106 under the control electrode 108 of the FET 602 does not serve as a floating gate. Additionally, since the insulating film 105 does not exist, the voltage dependence of on-current may be further improved and more easily controlled by the control electrode 108. In FIG. 6(*c*), the gate electrode of the FET 602 is configured of a metallic layer identical to the gate electrode of the FET 601, that is, it is configured of the metallic layers where the charge storage layer 106 and the control electrode 108 are directly stacked. However, it may also be preferred that the gate electrode of the FET 602 is configured of a single metallic layer or of multi-metallic layers, which are different from the charge storage layer 106 and the control electrode 108.

In the twelfth embodiment shown in FIG. 6(*c*), the configuration of the FET 601 may be similar to that of the eighth embodiment. In this embodiment, the charge storage layer 106 is replaced by the charge storage insulating film 118. Then, a sufficient quantity of the negative charge is stored there for the threshold to be positive. Additionally, in the FET 602, neither the charge storage layer 106 nor the charge storage insulating film 118 is adopted, and the control electrode 108 may be formed directly on the AlGaN layer 104. Moreover, the control electrode 108 of the FET 602 may be formed of a different metallic layer from the control electrode 108 of the FET 601.

FIG. 6(*d*) is a drawing illustrating the horizontal projection related to the tenth, eleventh, and twelfth embodiments shown in FIGS. 6(*a*) to (*c*), respectively. The source electrode 109 and the drain electrode 110 are configured of a plurality of fingers. The FET 601 and the FET 602 are laid meandering between those fingers of the source electrode 109 and drain the electrode 110. Thus, large current switching is enabled. Additionally, the control electrodes 108 of the FET 601 and the FET 602 may be preferably electrically connected with each other in the cell region or in the cell isolation region. Alternatively, they may be supplied with voltage independently from the external. FIG. 6(*d*) shows the case in which the control electrodes 108 of both the FET 601 and the FET 602 are connected to the control electrode supplying pad 603 located in the cell isolation region 116.

FIG. 6(*e*) shows the thirteenth embodiment. The present embodiment is obtained by adding a field plate 610 to the tenth embodiment on the side of the drain electrode 110 above the control electrode 108. The rest is identical to those of the tenth embodiment. The field plate 610 is almost the same in potential as the source electrode 109. Thus, the field concentration at the drain edge of the FET 602 is suppressed when a high voltage is applied to the drain electrode 110 during the stand-by that the control electrode 108 is 0 V. This improves the breakdown voltage of the FET 602. The field plate improves the breakdown voltage of the FET 602 in the eleventh and twelfth embodiments by adding it in a similar manner.

In the above-mentioned embodiments, the nitride semiconductors are assumed to be GaN and AlGaN. The band gap of AlGaN is larger than that of GaN. Therefore, a conductive channel is formed on the side of GaN at the interface between AlGaN and GaN. This channel is used in the above-mentioned embodiments. It may also be preferred to use nitride semiconductors different from GaN and AlGaN. For example, nitride semiconductor including Indium, such as InN, InGaN, InAlN and so forth, are also preferable. The materials and the composition ratio are to be selected to form a layer having a wider band gap above that having narrower band gap.

In addition, in order to protect the surface of the second nitride semiconductor, another nitride semiconductor having a different composition may be inserted above. For example, in the case that the first nitride semiconductor is GaN and that the second semiconductor is AlGaN, a thin GaN layer may be inserted on AlGaN.

The nitride semiconductor transistor devices according to the present disclosure may be useful to serve mainly as power switches to be used in power supply circuits, etc. In addition, they may also be useful to serve as high frequency transistors to be used in wireless communication, sensors and so forth.

What is claimed is:

1. A nitride semiconductor transistor device comprising:
a substrate;
a first nitride semiconductor layer formed over the substrate;
a second nitride semiconductor layer formed over the first nitride semiconductor layer, wherein a band gap of the second nitride semiconductor layer is wider than a band gap of the first nitride semiconductor layer;
a first insulating film formed over the second nitride semiconductor layer;
a charge storage layer comprising a low resistivity layer made of metal or a semiconductor, wherein at least a portion of the charge storage layer is formed over the first insulating film formed over the second nitride semiconductor layer;
a source electrode and a drain electrode formed over the second nitride semiconductor and horizontally sandwiching the charge storage layer;
a first control electrode electrostatic-capacitively coupled with the charge storage layer via a first capacitor;
a second insulating film formed over at least a portion of the charge storage layer, wherein the first control electrode is formed over the second insulating film, wherein the second insulating film serves as an interlayer film between the charge storage layer and the first control electrode to form the first capacitor; and
an electrically inactive cell isolation region formed on the substrate,
wherein the device is configured to induce an electric current flowing between the source and drain electrodes through a conductive channel at an interface between the first and second nitride semiconductor layers, wherein the device is configured to adjust the electric current by adjusting a potential of the charge storage layer, wherein the device is configured to control the potential by a voltage applied to the first control electrode, wherein the device is configured to adjust a threshold voltage at which the electric current is shut off by the voltage applied to the first control electrode by adjusting a quantity of charge stored in the charge storage layer, and
wherein the charge storage layer is extended to overlap with the cell isolation region, wherein at least a portion of the second insulating film is formed over a portion of the charge storage layer overlapping with the cell isolation region, and wherein at least a portion of the first control electrode is formed over the second insulating film over the portion of the charge storage layer overlapping with the cell isolation region.

2. The nitride semiconductor transistor device according to claim 1, wherein the quantity of charge stored in the charge storage layer is negative and the threshold voltage is made positive by controlling the quantity of charge stored in the charge storage layer.

3. The nitride semiconductor transistor device according to claim 2, further comprising a second control electrode formed over the second nitride semiconductor layer between the charge storage layer and the drain electrode, wherein the device is configured to adjust the electric current flowing between the source and drain electrodes through the conductive channel induced between the first and second nitride semiconductor layers thereunder with a voltage applied to the second control electrode, and wherein the threshold voltage for the voltage applied to the second control electrode to shut off the electric current is negative.

4. The nitride semiconductor transistor device according to claim 1, further comprising a third insulating film formed on at least a portion of the cell isolation region, and wherein at least a part of the portion of the charge storage layer overlapping with the cell isolation region is formed on the third insulating film.

5. The nitride semiconductor transistor device according to claim 4, wherein a thickness of the third insulating film is larger than a thickness of the first insulating film, wherein a capacitance of the third insulating film per unit area is smaller than a capacitance of the first insulating film per unit area, and wherein the capacitances of the first and third insulating films per unit area are defined by thicknesses and dielectric constants of the first and third insulating films.

6. The nitride semiconductor transistor device according to claim 1, wherein the first nitride semiconductor layer comprises GaN, and wherein the second nitride semiconductor layer comprises AlxGa1−xN, wherein 0<x≤1.

7. The nitride semiconductor transistor device according to claim 1, wherein at least a bottom layer of the first insulating film comprises aluminum oxide.

8. The nitride semiconductor transistor device according to claim 1, further comprising a second capacitor formed between the charge storage layer and the second nitride semiconductor layer, wherein a capacitance of the first capacitor is larger than a capacitance of the second capacitor.

9. A nitride semiconductor transistor device comprising:
a substrate;
a first nitride semiconductor layer formed over the substrate;
a second nitride semiconductor layer formed over the first nitride semiconductor layer, wherein a band gap of the second nitride semiconductor layer is wider than a band gap of the first nitride semiconductor layer;
a first insulating film formed over the second nitride semiconductor layer;
a charge storage insulating film formed over the first insulating film;
a second insulating film formed over the charge storage insulating film;
a first control electrode formed over the second insulating film; and
a source electrode and a drain electrode formed over the second nitride semiconductor layer and horizontally sandwiching the first control electrode,
wherein the charge storage insulating film stores a negative charge,
wherein the device is configured to induce an electric current flowing between the source and drain electrodes through a conductive channel at an interface between the first and second nitride semiconductor layers, wherein the device is configured to adjust the electric current by adjusting a voltage applied to the first control electrode, wherein the device is configured to adjust a threshold voltage positive by the negative charge stored in the charge storage insulating film, wherein the electric current is shut off at the threshold voltage applied to the first control electrode, wherein the charge storage insulating film comprises charge traps with energy levels inside both band gaps of the first and second insulating films, and wherein the charge traps trap and store at least a portion of the negative charge.

10. The nitride semiconductor transistor device according to claim 9, wherein the charge storage insulating film comprises silicon nitride.

11. The nitride semiconductor transistor device according to claim 9, further comprising a second control electrode formed above the second nitride semiconductor layer between the first control electrode and the drain electrode, wherein the device is configured to adjust the electric current flowing between the source and drain electrodes through the conductive channel induced between the first and second nitride semiconductor layers thereunder with a voltage applied to the second control electrode, and wherein the threshold voltage for the voltage applied to the second control electrode to shut off the electric current is negative.

12. The nitride semiconductor transistor device according to claim 9, wherein the first nitride semiconductor layer comprises GaN, and wherein the second nitride semiconductor layer comprises AlxGa1-xN, wherein 0<x ≤1.

13. The nitride semiconductor transistor device according to claim 9, wherein at least a bottom layer of the first insulating film comprises aluminum oxide.

14. A nitride semiconductor transistor device comprising:
a substrate;
a first nitride semiconductor layer formed over the substrate;
a second nitride semiconductor layer formed over the first nitride semiconductor layer, wherein a band gap of the second nitride semiconductor layer is wider than a band gap of the first nitride semiconductor layer;
a first insulating film formed over the second nitride semiconductor layer;
a charge storage layer comprising a low resistivity layer made of metal or semiconductor, wherein at least a portion of the charge storage layer is formed over the first insulating film over the second nitride semiconductor layer;
a source electrode and a drain electrode formed over the second nitride semiconductor and horizontally sandwiching the charge storage layer;
a first control electrode electrostatic-capacitively coupled with the charge storage layer via a first capacitor,
wherein the first capacitor comprises a bottom electrode made of a low resistive layer, a second insulating film formed over the bottom electrode, and the first control electrode, wherein the first control electrode is formed over the second insulating film formed over the bottom electrode; and
an electrically inactive cell isolation region formed on the substrate, wherein the first capacitor is placed over the electrically inactive cell isolation region, and wherein the charge storage layer is electrically connected to the bottom electrode,
wherein the device is configured to induce an electric current flowing between the source and drain electrodes through a conductive channel at an interface between the first and second nitride semiconductor layers, wherein the device is configured to adjust the electric current by adjusting a potential of the charge storage layer, wherein the device is configured to control the potential by a voltage applied to the first control electrode, and wherein the device is configured to adjust a threshold voltage at which the electric current is shut off by the voltage applied to the first control electrode by adjusting a quantity of charge stored in the charge storage layer.

15. A nitride semiconductor transistor device comprising:
a substrate;
a first nitride semiconductor layer formed over the substrate;
a second nitride semiconductor layer formed over the first nitride semiconductor layer, wherein a band gap of the second nitride semiconductor layer is wider than a band gap of the first nitride semiconductor layer;
a first insulating film formed over the second nitride semiconductor layer;
a charge storage layer comprising a low resistivity layer made of metal or a semiconductor, wherein at least a portion of the charge storage layer is formed over the first insulating film formed over the second nitride semiconductor layer;
a source electrode and a drain electrode formed over the second nitride semiconductor and horizontally sandwiching the charge storage layer; and
a first control electrode electrostatic-capacitively coupled with the charge storage layer via a first capacitor,
wherein the device is configured to induce an electric current flowing between the source and drain electrodes through a conductive channel at an interface between the first and second nitride semiconductor layers, wherein the device is configured to adjust the electric current by adjusting a potential of the charge storage layer, wherein the device is configured to control the potential by a voltage applied to the first control electrode, wherein the device is configured to adjust a threshold voltage at which the electric current is shut off by the voltage applied to the first control electrode by adjusting a quantity of charge stored in the charge storage layer,
wherein the first capacitor comprises a bottom electrode made of a low resistive layer, a second insulating film formed over the bottom electrode, and the first control electrode, wherein the first control electrode is formed over the second insulating film formed over the bottom electrode,
wherein the first capacitor is stacked over the at least the portion of the charge storage layer formed over the first insulating film formed over the second nitride semiconductor layer, and wherein the charge storage layer is electrically connected to the bottom electrode.

16. A nitride semiconductor transistor device comprising:
a substrate;
a first nitride semiconductor layer formed over the substrate;
a second nitride semiconductor layer formed over the first nitride semiconductor layer, wherein a band gap of the second nitride semiconductor layer is wider than a band gap of the first nitride semiconductor layer;
a first insulating film formed over the second nitride semiconductor layer;
a charge storage layer comprising a low resistivity layer made of metal or semiconductor, wherein at least a portion of the charge storage layer is formed over the first insulating film formed over the second nitride semiconductor layer;

a source electrode and a drain electrode formed over the second nitride semiconductor and horizontally sandwiching the charge storage layer; and a first control electrode electrostatic-capacitively coupled with the charge storage layer via a first capacitor, wherein the device is configured to induce an electric current flowing between the source and drain electrodes through a conductive channel at an interface between the first and second nitride semiconductor layers, wherein the device is configured to adjust the electric current by adjusting a potential of the charge storage layer, wherein the device is configured to control the potential by a voltage applied to the first control electrode, wherein the device is configured to adjust a threshold voltage at which the electric current is shut off by the voltage applied to the first control electrode by adjusting a quantity of charge stored in the charge storage layer, wherein the first capacitor is placed outside the substrate.

* * * * *